United States Patent
Okajima

(10) Patent No.: US 8,835,897 B2
(45) Date of Patent: Sep. 16, 2014

(54) NONVOLATILE MEMORY DEVICE HAVING VARIABLE RESISTANCE MEMORY CELLS

(75) Inventor: Mutsumi Okajima, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 131 days.

(21) Appl. No.: 12/552,696

(22) Filed: Sep. 2, 2009

(65) Prior Publication Data

US 2010/0237311 A1 Sep. 23, 2010

(30) Foreign Application Priority Data

Mar. 23, 2009 (JP) ................................. 2009-070962

(51) Int. Cl.
| | |
|---|---|
| H01L 29/06 | (2006.01) |
| H01L 47/00 | (2006.01) |
| H01L 27/24 | (2006.01) |
| H01L 45/00 | (2006.01) |

(52) U.S. Cl.
CPC ............. *H01L 27/2409* (2013.01); *H01L 45/04* (2013.01); *H01L 45/149* (2013.01); *H01L 27/2481* (2013.01); *H01L 45/1233* (2013.01); *H01L 45/146* (2013.01)
USPC ........................................ 257/5; 257/E27.004

(58) Field of Classification Search
CPC ...................... H01L 27/2409; H01L 27/2481
USPC ............................................... 257/5, E27.004
See application file for complete search history.

(56) References Cited

U.S. PATENT DOCUMENTS

| | | | |
|---|---|---|---|
| 6,185,122 B1 * | 2/2001 | Johnson et al. | ............... 365/103 |
| 6,579,760 B1 | 6/2003 | Lung | |
| 6,750,101 B2 | 6/2004 | Lung | |
| 7,838,341 B2 * | 11/2010 | Dennison | ...................... 438/128 |
| 2003/0186481 A1 | 10/2003 | Lung | |
| 2008/0128853 A1 | 6/2008 | Choi et al. | |
| 2008/0185573 A1* | 8/2008 | Sun et al. | .......................... 257/4 |
| 2008/0258129 A1* | 10/2008 | Toda | ................................ 257/5 |

FOREIGN PATENT DOCUMENTS

| | | |
|---|---|---|
| JP | 2003-303941 A | 10/2003 |
| KR | 10-2004-0107487 A | 12/2004 |
| KR | 10-2007-0062435 A | 6/2007 |
| KR | 10-2008-0043173 A | 5/2008 |

OTHER PUBLICATIONS

Myoung-Jae Lee, et al., "2-stack 1D-1R Cross-point Structure with Oxide Diodes as Switch Elements for High Density Resistance RAM Applications", Electron Devices Meeting, 2007, IEDM 2007. IEEE International, Dec. 10-12, 2007, pp. 771-774.

S. B. Herner, et al., "Vertical p-i-n Polysilicon Diode with Antifuse for Stackable Field-Programmable ROM", IEEE Electron Device Letters, vol. 25, No. 5, May 2004, pp. 271-273.

Office Action issued Aug. 13, 2013 in Japanese Patent Application No. 2009-070962 (with English-language translation).

* cited by examiner

*Primary Examiner* — Hsin-Yi Hsieh

(74) *Attorney, Agent, or Firm* — Oblon, Spivak, McClelland, Maier & Neustadt, L.L.P.

(57) ABSTRACT

A nonvolatile memory device according to an embodiment of the present invention includes: a first wire embedded in a first wiring groove extending in an X direction formed in a first interlayer insulating film; a second interlayer insulating film formed above the first interlayer insulating film; a second wire embedded in a second wiring groove extending in a Y direction formed in the second interlayer insulating film; and a variable resistance memory cell including a variable resistive layer and a rectifying layer arranged to be held between the first wire and the second wire in a position where the first wire and the second wire intersect. A dimension in a plane perpendicular to a thickness direction of the variable resistance memory cell is specified by widths of the first and second wires.

2 Claims, 28 Drawing Sheets

NONVOLATILE MEMORY DEVICE HAVING VARIABLE RESISTANCE MEMORY CELLS

CROSS-REFERENCE TO RELATED APPLICATIONS

This application is based upon and claims the benefit of priority from the prior Japanese Patent Application No. 2009-70962, filed on Mar. 23, 2009; the entire contents of which are incorporated herein by reference.

BACKGROUND OF THE INVENTION

1. Field of the Invention

The present invention relates to a nonvolatile memory device and a method of manufacturing the same.

2. Description of the Related Art

In recent years, a resistive random access memory (ReRAM) that stores, in a nonvolatile manner, resistance information, for example, a high resistance state and a low resistance state of an electrically rewritable resistance change element attracts attention as a nonvolatile memory device. In such a ReRAM, for example, variable resistance memory cells in which resistance change elements as storage elements and rectifying elements such as diodes are connected in series are arranged in an array shape in intersections of a plurality of bit lines extending in parallel to a first direction and a plurality of word lines extending in parallel to a second direction perpendicular to the first direction (see, for example, Myoung-Jae Lee; Youngsoo Park; Bo-Soo Kang; Seung-Eon Ahn; Changbum Lee; Kihwan Kim; Wenxu Xianyu; Stefanovich, G.; Jung-Hyun Lee; Seok-Jae Chung; Yeon-Hee Kim; Chang-Soo Lee; Jong-Bong Park; and In-Kyeong Yoo, "2-stack 1D-1R Cross-point Structure with Oxide Diodes as Switch Elements for High Density Resistance RAM Applications,", IEEE, pp. 771-774, 2007 (Non-Patent Document 1). Examples of the resistance change elements include metal oxides such as NiO, a high resistance state and a low resistance state of which can be switched according to control of a voltage value and voltage application time.

As a memory cell array having structure similar to the ReRAM, a field-programmable ROM having structure in which memory cells of a columnar structure are arranged in an array shape is known. In the memory cells of the columnar structure, diode layers and insulating layers are connected in series in intersections of a plurality of first wires extending in parallel to a first direction and a plurality of second wires extending in parallel to a second direction perpendicular to the first direction (see, for example, S. B. Herner, A. Bandyopadhyay, S. V. Dunton, V. Eckert, J. Gu, K. J. Hsia, S. Hu, C. Jahn, D. Kidwell, M. Konevecki, M. Mahajani, K. Park, C. Petti, S. R. Radigan, U. Raghuram, J. Vienna, M. A. Vyvoda, "Vertical p-i-n polysilicon diode with antifuse for stackable field-programmable ROM", Electron Device Letters, IEEE, vol. 25, no. 5, pp. 271-273, May 2004 (Non-Patent Document 2)). The field-programmable ROM is manufactured as explained below. First, after a titanium nitride (TiN) film, a p-type polysilicon film, a non-doped polysilicon film are laminated and formed in order on a first wiring layer made of tungsten (W), this laminated film is etched in a columnar shape. Subsequently, spaces in the columnar structure are filled with a silicon oxide film ($SiO_2$ film). The surface of the non-doped polysilicon film is exposed and phosphor (P) is ion-implanted in the surface to form an n-type polysilicon film to thereby form a diode layer of a p-i-n structure. Thereafter, a silicon oxide film is formed in an upper part of the diode layer by a rapid heating and oxidation method. A second wiring layer is formed on the silicon oxide film. Then, the field-programmable ROM is obtained.

However, in the method disclosed in Non-Patent Document 2, when the laminated layer of the titanium nitride film and the polysilicon film is formed in the columnar structure, it is likely that an etching gas and liquid used in the etching come into contact with a side of the laminated layer and deteriorate characteristics of the titanium nitride film and the polysilicon film. Because the silicon oxide film is filled in the spaces in the columnar structure, it is likely that the titanium nitride film and the polysilicon film included in the columnar structure are oxidized. Further, in addition to a lithography process necessary for patterning the lower layer wiring and the upper layer wiring, a lithography process for patterning the laminated layer into the columnar structure is necessary. Therefore, manufacturing cost increases. When the method of manufacturing the field-programmable ROM having such problems is directly applied to the ReRAM, the same problems are likely to be caused.

BRIEF SUMMARY OF THE INVENTION

A nonvolatile memory device according to an embodiment of the present invention comprises: a first wire embedded in a groove that is formed in a first insulating film and extends in a first direction; a second insulating film formed above the first insulating film; a second wire embedded in a groove that is formed in the second insulating film and extends in a second direction; and a variable resistance memory cell including a resistance change element and a rectifying element arranged to be held between the first wire and the second wire in a position where the first wire and the second wire intersect, wherein a dimension in a plane perpendicular to a thickness direction of the variable resistance memory cell is specified by widths of the first and second wires.

A method of manufacturing a nonvolatile memory device according to an embodiment of the present invention comprises: forming a first stopper film on a first insulating film; forming a first wiring groove extending in a first direction and reaching predetermined depth of the first insulating film; embedding a conductive film to fill the first wiring groove; etching back the conductive film embedded in the first wiring groove to form a first wire having predetermined thickness; forming a second insulating film that fills the first wiring groove and is higher than an upper surface of the first stopper film; forming a second stopper film on the second insulating film; forming, in the second insulating film and the second stopper film, a second wiring groove extending in a second direction and reaching the upper surface of the first stopper film and further forming, in an intersection position of the first wiring groove and the second wiring groove in which the first stopper film is not formed, a first memory cell forming groove reaching an upper surface of the first wire; embedding a variable resistance memory cell including a first variable resistive layer and a first rectifying layer in the first memory cell forming groove; and embedding a conductive film in the second wiring groove to form a second wire.

DETAILED DESCRIPTION OF THE INVENTION

Exemplary embodiments of the present invention are explained in detail below with reference to the accompanying drawings. The present invention is not limited by the embodiments. Sectional view of nonvolatile memory devices used in embodiments explained below are schematic. A relation between the thickness and the width of a layer, a ratio of thicknesses of layers, and the like are different from real ones. Further, film thicknesses explained below are examples only. Film thicknesses are not limited to these film thicknesses.

Figure 1:
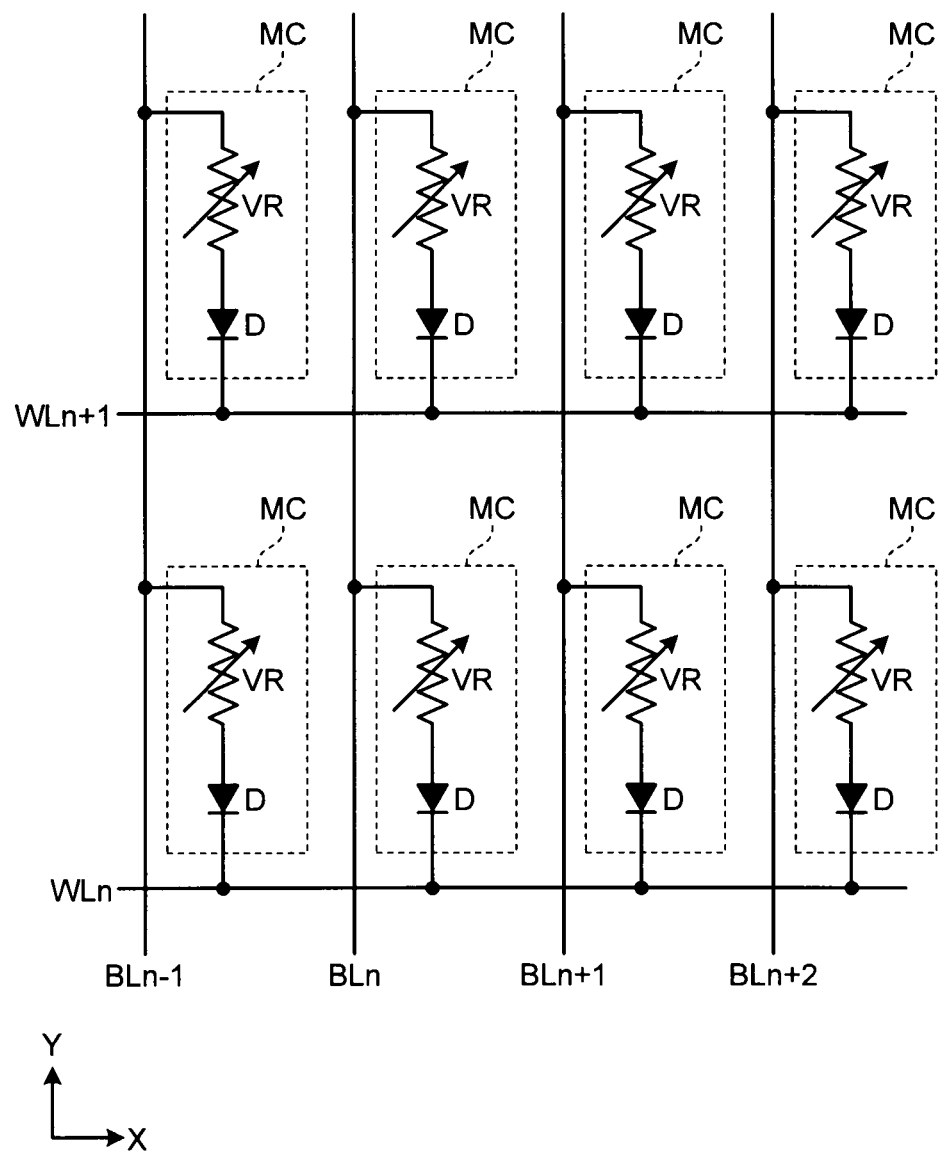
FIG. 1 is a diagram of an example of a memory cell array configuration of a nonvolatile memory device according to an embodiment of the present invention.

FIG. 1 is a diagram of an example of a memory cell array configuration of a nonvolatile memory device according to an embodiment of the present invention. In the figure, a left to right direction in a paper surface is represented as X direction and a direction perpendicular to the X direction in the paper surface is represented as Y direction. Word lines WLi (i=n, n+1, ...) extending in parallel to the X direction (a row direction) and bit lines BLj (j=n−1, n, n+1, n+2, ...) extending in parallel to the Y direction (a column direction) at height different from that of the word lines WLi are disposed to intersect each other. Variable resistance memory cells MC in which resistance change elements VR and rectifying elements D are connected in series are arranged in the intersections. In this example, one ends of the resistance change elements VR are connected to the bit lines BLj and the other ends thereof are connected to the word lines WLi via the rectifying elements D.

A plurality of the variable resistance memory cells MC can be laminated and formed in a direction perpendicular to both the X direction and the Y direction. In this case, as explained later, the word lines WLi or the bit lines BLj are shared by the variable resistance memory cells MC in upper and lower layers. Wiring is formed such that the directions of the word lines WLi and the bit lines BLi are orthogonal to each other above and below the memory cells MC.

Figure 2:
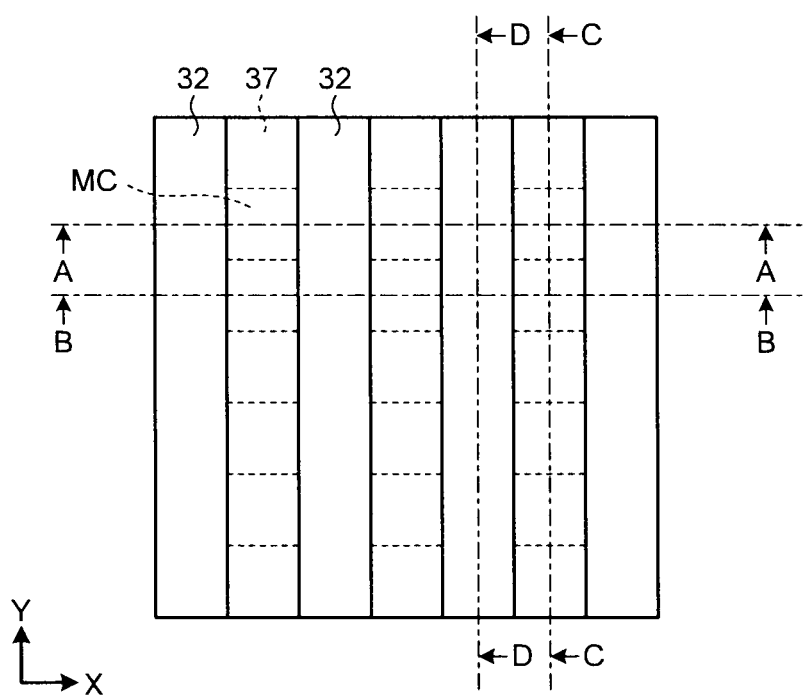
FIG. 2 is a plan view of an example of a memory cell area of the nonvolatile memory device.
Figure 3A:
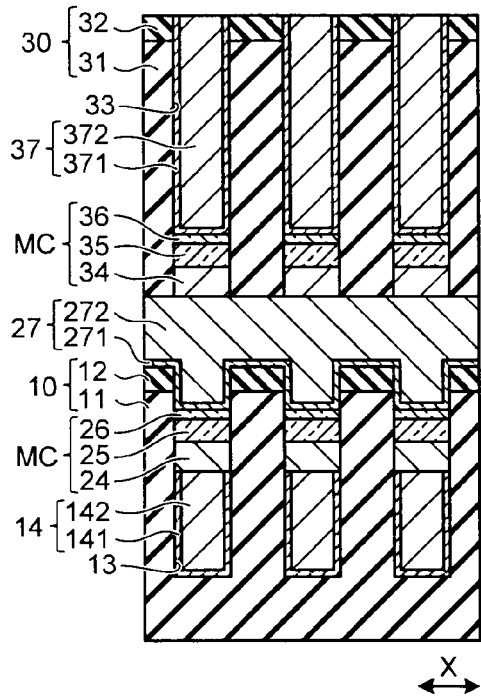
FIG. 3A is an A-A sectional view of the nonvolatile memory device shown in FIG. 2.
Figure 3B:
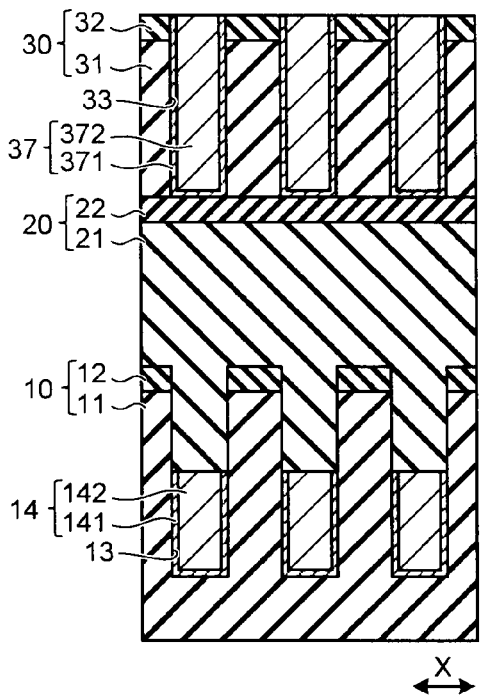
FIG. 3B is a B-B sectional view of the nonvolatile memory device shown in FIG. 2.
Figure 3C:
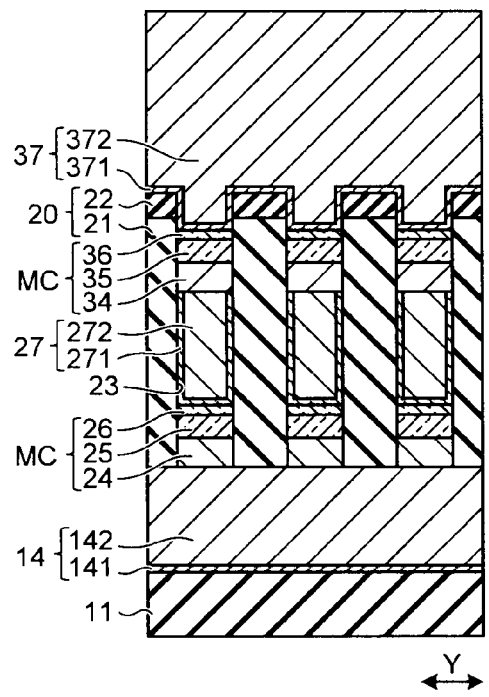
FIG. 3C is a C-C sectional view of the nonvolatile memory device shown in FIG. 2.
Figure 3D:
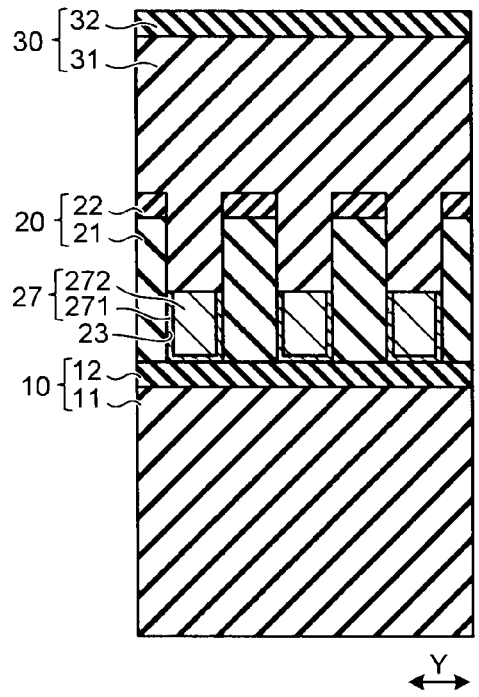
FIG. 3D is a D-D sectional view of the nonvolatile memory device shown in FIG. 2.
Figure 4:
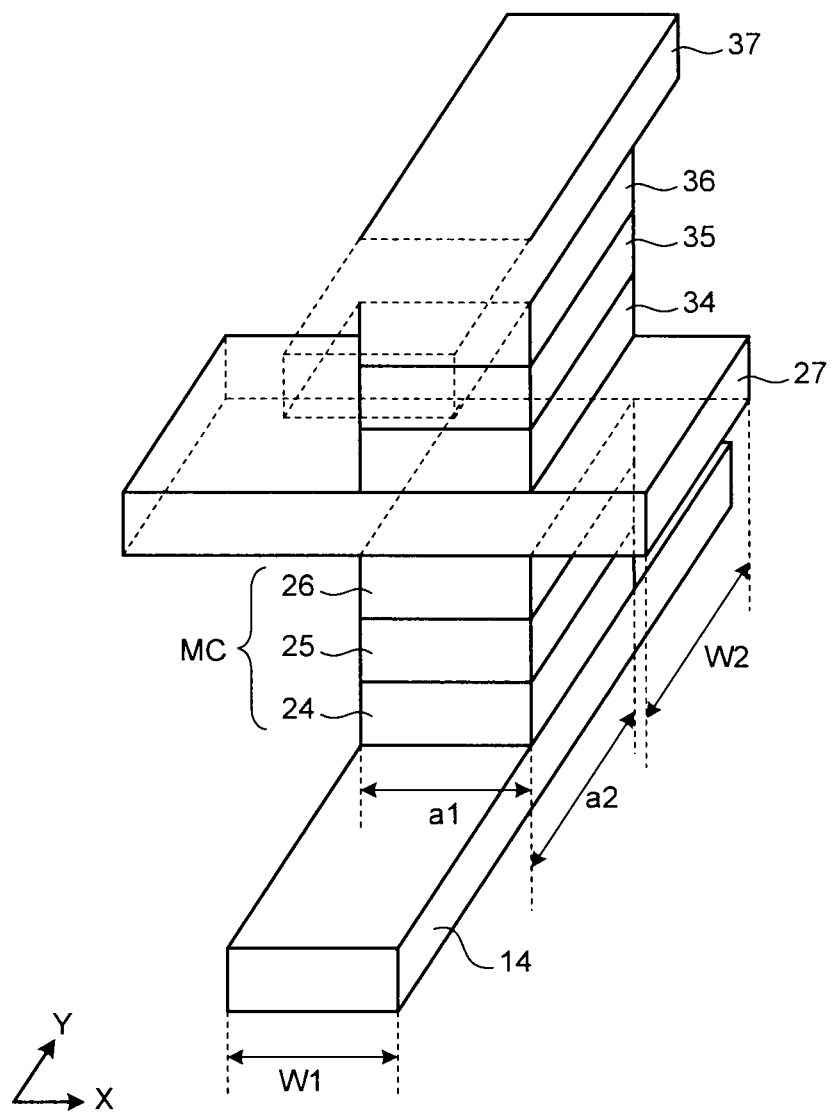
FIG. 4 is a schematic perspective view of the structure of a memory cell of the nonvolatile memory device according to the first embodiment.

FIG. 2 is a plan view of an example of a memory cell area of the nonvolatile memory device. FIGS. 3A to 3D are sectional views of the nonvolatile memory device shown in FIG. 2. FIG. 3A is an A-A sectional view of FIG. 2, FIG. 3B is a B-B sectional view of FIG. 2, FIG. 3C is a C-C sectional view of FIG. 2, and FIG. 3D is a D-D sectional view of FIG. 2. FIG. 4 is a schematic perspective view of the structure of the memory cell of the nonvolatile memory device according to the first embodiment.

In the nonvolatile memory device, a first interlayer insulating film 10 in which a silicon oxide film 11 and a silicon nitride film 12, which functions as a stopper film, are laminated is formed on a not-shown semiconductor substrate on which a complementary metal-oxide semiconductor (CMOS) logic circuit is formed. First wires 14 are formed in first wiring grooves 13 extending in the Y direction and formed at predetermined intervals in the X direction in the first interlayer insulating film 10. The first wires 14 are formed by a barrier metal film 141 and a wiring material film 141. The barrier metal film 141 is formed to suppress diffusion of a wire material to the first interlayer insulating film 10 such as a TiN film and coat the sides and the bottoms of the first wiring grooves 13. The wiring material film 142 of W or the like fills the first wiring grooves 13 coated with the barrier metal film 141.

The variable resistance memory cells MC of the columnar structure are formed on the first wires 14. The variable resistance memory cells MC has structure in which a variable resistive layer 24 and a rectifying layer 25 are laminated.

The variable resistive layer 24 is formed of a material, which can take a plurality of resistance states (e.g., a high resistance state and a low resistance state) of which can be switched according to control of, for example, a voltage value and voltage application time. Examples of the material forming the variable resistive layer 24 include metal oxides of Ni, Ti, Hf, Mn, Zn, Al, Cu, and the like and carbon materials such as carbon nanotube.

The rectifying layer 25 has a function of feeding an electric current, which flows to the variable resistive layer 24, only in one direction. As the rectifying layer 25, a semiconductor layer having PN junction and a semiconductor layer having PIN structure can be used. In the first embodiment, a semiconductor layer is set in contact with the variable resistive layer 24 to form a Schottky barrier to be in Schottky contact with the variable resistive layer 24. As the rectifying layer 25, in this example, P-type polysilicon in which a P-type impurity such as B is introduced is used.

A P-type impurity high concentration diffusion layer 26 for reducing the width of the Schottky barrier between second wires 27 and the rectifying layer 25 is formed in an upper part of the rectifying layer 25.

A silicon oxide film 21 is formed on the first interlayer insulating film 10 to fill spaces among the adjacent variable resistance memory cells MC on the first wiring layer 14. A silicon nitride film 22, which functions as a stopper film, is formed on the silicon oxide film 21. A second interlayer insulating film 20 is formed by the silicon oxide film 21 and the silicon nitride film 22. Second wiring grooves 23 extending in the X direction and formed at predetermined intervals in the Y direction are formed in positions corresponding to formation positions of the variable resistance memory cells MC in the second interlayer insulating film 20. Second wires 27 are formed in the second wiring grooves 23 to hold the variable resistance memory cells MC between the first wires 14 and the second wires 27. Like the first wires 14, the second wires 27 are formed by a barrier metal film 271 such as a TiN film and a wring material film 272 of W or the like that fills the second wiring grooves 23 coated with the barrier metal film 271.

The variable resistance memory cells MC in an upper layer of the columnar structure are formed on the second wires 27 corresponding to formation positions of the variable resistance memory cells MC in the lower layer. The variable resistance memory cells MC has structure in which a variable resistive layer 34 and a rectifying layer 35 are laminated.

Like the variable resistive layer 24 in the lower layer, the variable resistive layer 34 is formed of a metal oxide of Ni, Ti, Hf, Mn, Zn, Al, Cu, or the like or a carbon material such as carbon nanotube. As the rectifying layer 35, N-type polysilicon in which an N-type impurity such as P is introduced is used. An N-type impurity high concentration diffusion layer 36 for reducing the width of a Schottky barrier between third wires 37 and the rectifying layer 35 is formed on the rectifying layer 35.

A silicon oxide film 31 is formed on the second interlayer insulating film 20 to fill spaces among the adjacent variable resistance memory cells MC on the second wires 27. A silicon nitride film 32, which functions as a stopper film, is formed on the silicon oxide film 31. A third interlayer insulating film 30 is formed by the silicon oxide film 31 and the silicon nitride film 32. Third wiring grooves 33 extending in the Y direction and formed at predetermined intervals in the X direction are formed in positions corresponding to formation positions of the variable resistance memory cells MC in the third interlayer insulating film 30. Third wires 37 are formed in the third wiring grooves 33 to hold the variable resistance memory cells MC between the third wires 37 and the second wires 27. Like the first wires 14, the third wires 37 are formed by a barrier metal film 371 such as a TiN film and a wiring material film 372 of W or the like that fills the third wiring grooves 33 coated with the barrier metal film 371.

Length a1 in the X direction of the variable resistance memory cells MC in a first layer is specified by width (length in the X direction) W1 of the first wires 14 extending in the Y direction. Length a2 in the Y direction is specified by width (length in the Y direction) W2 of the second wires 27 extending in the X direction. The length of the variable resistance memory cells MC in a second layer is specified by the width of wires arranged above and below the variable resistance memory cells MC. Recording density can be increased by laminating the variable resistance memory cells MC in the direction perpendicular to both the X direction and the Y direction in this way. In this example, the first wires 14 and the third wires 37 extend in the X direction and the second wires 27 extend in the Y direction perpendicular to the X direction. However, the first and third wires 14 and 37 and the second wires 27 only have to intersect each other.

Figure 5A:
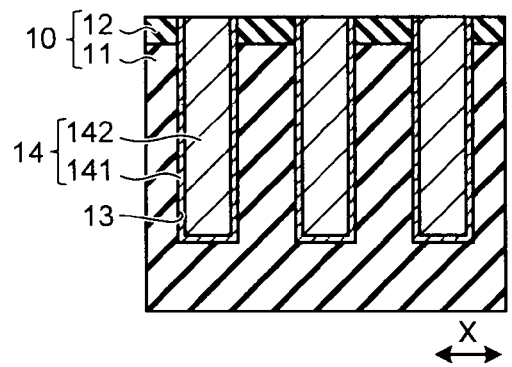
FIGS. 5A to 5O are schematic sectional views corresponding to the A-A section shown in FIG. 2 for explaining an example of a procedure of a method of manufacturing a nonvolatile memory device according to the first embodiment.

A method of manufacturing the nonvolatile memory device having such structure is explained. FIGS. 5A to 8O are schematic sectional views of an example of a procedure of a method of manufacturing a nonvolatile memory device according to the first embodiment. FIGS. 5A to 5O correspond to the A-A sectional view of FIG. 2, FIGS. 6A to 6O correspond to the B-B sectional view of FIG. 2, FIGS. 7A to 7O correspond to the C-C sectional view of FIG. 2, and FIGS. 8A to 8O correspond to the D-D sectional view of FIG. 2.

First, a not-shown CMOS logic circuit is formed on a not-shown semiconductor substrate such as an Si substrate. The silicon oxide film 11 having thickness of, for example, about 300 nanometers and the silicon nitride film 12 having thickness of, for example, about 20 nanometers, which functions as a stopper film, are laminated on the semiconductor substrate, on which the CMOS logic circuit is formed, to form the first interlayer insulating film 10. Subsequently, resist is applied on the silicon nitride film 12. Patterning is performed by the lithography technique such that opening patterns extending in the Y direction are formed at predetermined intervals in the X direction. Etching of the silicon nitride film 12 and the silicon oxide film 11 is performed with the patterned resist film as a mask to form the first wiring grooves 13. The depth of the first wiring grooves 13 is set to, for example, 200 nanometers.

After the resist film is removed by ashing, the first wires 14 including the barrier metal film 141 such as a TiN film and the wiring material film 142 such as a W film is formed on the first interlayer insulating film 10, in which the first wiring grooves 13 are formed, by the physical vapor deposition (PVD) method or the chemical vapor deposition (CVD) method. The barrier metal film 141 is formed with thickness of about several nanometers to cover the bottoms and the sides of the first wiring grooves 13. The wiring material film 142 is formed to fill the inside of the first wiring grooves 13 in which the barrier metal film 141 is formed. The first wires 14 formed on the silicon nitride film 12 are removed, until the silicon nitride film 12 is exposed, by the chemical mechanical polishing (CMP) method to flatten an upper surface of the silicon nitride film 12 (FIGS. 5A, 6A, 7A, and 8A).

Subsequently, under a condition that the first wires (the TiN film and the W film) are more easily etched than the silicon nitride film 12, the surface of the first interlayer insulating film 10 on which the first wires 14 are formed is etched by the dry etching method to remove the barrier metal film 141 and the wiring material film 142 embedded in upper parts of the first wring grooves 13 (FIGS. 5B, 6B, 7B, and 8B). Thickness to be removed is set to, for example, 100 nanometers.

Thereafter, the silicon oxide film 21 is deposited over the entire surface of the first interlayer insulating film 10 by the CVD method to fill the recessed first wring grooves 13 and subsequently the silicon nitride film 22, which functions as a stopper film, is deposited to form the second interlayer insulating film 20 (FIGS. 5C, 6C, 7C, and 8C). For example, the silicon oxide film 21 is formed with thickness of about 200 nanometers from the upper surface of the silicon nitride film 12. The silicon nitride film 22 is formed with thickness of about 20 nanometers.

Resist is applied on the silicon nitride film 22. Patterning is performed by the lithography technique such that opening patterns extending in the X direction are formed at predetermined intervals in the Y direction. Etching of the silicon nitride film 22 and the silicon oxide film 21 is performed with the patterned resist film as a mask (FIGS. 5D, 6D, 7D, and 8D). When the etching of the silicon oxide film 21 is performed, under a condition that the silicon oxide film 21 is more easily etched than the silicon nitride film 12 and a condition that the silicon oxide film 21 is more easily etched than the first wires 14 (the TiN film and the W film), the etching of the silicon oxide film 21 is performed, until an upper surface of the first wires 14 is exposed, in an area in which the silicon nitride film 12 is not formed. Consequently, for example, even while the silicon oxide film 21 lower than the silicon nitride film 12 is etched in the area in which the silicon nitride film 12 is not formed at the step shown in FIGS. 5C and 7C, the etching is stopped by the silicon nitride film 12 in another area. As a result, the second wiring grooves 23 are formed in an area higher than the silicon nitride film 12. In an area in which the silicon nitride film 12 is not formed, and in an area lower than the silicon nitride film 12, first memory cell forming grooves 23M specified by the width of the first wiring grooves 13 and the second wiring grooves 23 are formed.

Thereafter, a resistance change material film 24A is deposited to fill the first memory cell forming grooves 23M and the second wiring grooves 23 by using a technique such as the PVD method, the PCVD (plasma CVD) method, the LPCVD (low pressure CVD) method, or the coating method (FIGS. 5E, 6E, 7E, and 8E). As the resistance change material, metal oxides of Ni, Ti, Hf, Mn, Zn, Al, Cu, and the like and carbon materials such as carbon nanotube can be used. The resistance change material film 24A is formed such that the resistance change material film 24A is higher than an upper surface of the silicon nitride film 22 and an upper surface thereof is flat.

Under a condition that the resistance change material is more easily etched than the silicon nitride films 12 and 22, the resistance change material film 24A is etched back by the dry etching method. The resistance change material is left only in the first memory cell forming grooves 23M (intersections of the first wiring grooves 13 and the second wiring grooves 23) to form the variable resistive layer 24 (FIGS. 5F, 6F, 7F, and 8F). The thickness of the formed variable resistive layer 24 is 10 nanometers when, for example, NiO is used as the resistance change material. To improve film thickness controllability for the resistance change material left in the first memory cell forming grooves 23M, in processes of FIGS. 5E, 6E, 7E and 8E, an etch-back processing for the resistance change material film 24A can be performed after the resistance change material film 24A is deposited and then the resistance change material film 24A on the silicon nitride film 22 is removed by using the CMP method.

Thereafter, a P-type polysilicon film is deposited by using the LPCVD method to fill the first memory cell forming grooves 23M and the second wiring grooves 23. Thereafter, under a condition that the polysilicon film is more easily etched than the silicon nitride films 12 and 22, the P-type polysilicon film is etched back by the dry etching method to form the rectifying layer 25 including the P-type polysilicon film on the variable resistive layer 24 in the first memory cell forming grooves 23M (FIGS. 5G, 6G, 7G, and 8G). The thickness of the formed rectifying layer 25 (P-type polysilicon film) is, for example, 20 nanometers. To improve film thickness controllability for the P-type polysilicon film left in the first memory cell forming grooves 23M, the etch-back processing for the P-type polysilicon film can be performed after the P-type polysilicon film is deposited and then the P-type polysilicon film on the silicon nitride film 22 is removed by using the CMP method.

Further, for example, B can be implanted in the rectifying layer 25 as a P-type dopant by the ion implantation method and diffused by thermal treatment to form the P-type impurity high concentration diffusion layer 26 (FIGS. 5H, 6H, 7H, and 8H). The thickness of the formed P-type impurity high concentration diffusion layer 26 is, for example, 10 nanometers. Consequently, the thickness of the rectifying layer 25 is about 10 nanometers. This makes it possible to realize highly ohmic contact between second wires to be formed next and the P-type polysilicon film (the rectifying layer 25). In this way, the variable resistance memory cells MC in the first layer are formed.

Subsequently, as in the case of the first wires 14, the second wires 27 including the barrier meal film 271 such as a TiN film and the wiring material film 272 such as a W film are formed by the PVD method or the CVD method (FIGS. 5I, 6I, 7I, and 8I). The barrier metal film 271 and the wiring material film 272 fill in upper parts of the second wiring grooves 23 are removed by the dry etching method (FIGS. 5J, 6J, 7J, and 8J). Thickness to be removed is, for example, 100 nanometers.

Thereafter, the silicon oxide film 31 is deposited over the entire surface of the second interlayer insulting film 20 by the CVD method to fill the recessed second wiring grooves 23 and subsequently the silicon nitride film 32, which functions as a stopper film, is deposited to form the third interlayer insulating film 30 (FIGS. 5K, 6K, 7K, and 8K). For example, the silicon oxide film 31 is formed with thickness of about 200 nanometers from the upper surface of the silicon nitride film 22. The silicon nitride film 32 is formed with thickness of 20 nanometers.

As in the case of the second wires 27, resist is applied on the silicon nitride film 32. Patterning is performed by the lithography technique such that opening patterns extending in the Y direction are formed at predetermined intervals in the X direction. Etching of the silicon nitride film 32 and the silicon oxide film 31 is performed with the patterned resist film as a mask (FIGS. 5L, 6L, 7L, and 8L). When the etching of the silicon oxide film 31 is performed, under a condition that the silicon oxide film 31 is more easily etched than the silicon nitride film 22 and a condition that the silicon oxide film 31 is more easily etched than the second wires 27 (the TiN film and the W film), the etching of the silicon oxide film 31 is performed, until an upper surface of the second wires 27 is exposed, in an area in which the silicon nitride film 22 is not formed. Consequently, the third wiring grooves 33 are formed in an area higher than the silicon nitride film 22. In an area in which the silicon nitride film 22 is not formed, and in an area lower than the silicon nitride film 22, second memory cell forming grooves 33M specified by the width of the second wiring grooves 23 and the third wiring grooves 33 are formed.

Thereafter, as in the manufacturing process for the variable resistance memory cells MC in the first layer, a resistance change material film is deposited to fill the second memory cell forming grooves 33M and the third wiring grooves 33 by using a technique such as the PVD method, the PCVD method, the LPCVD method, or the coating method. Then, the resistance change material film is etched back by the dry etching method to leave the resistance change material film only in the second memory cell forming grooves 33M. Therefore, the variable resistive layer 34 (FIGS. 5M, 6M, 7M, and 8M) is formed. As the resistance change material, metal oxides of Ni, Ti, Hf, Mn, Zn, Al, Cu, and the like and carbon materials such as carbon nanotube can be used. The thickness of the formed variable resistive layer 34 is 10 nanometers when, for example, NiO is used as the resistance change material.

After the N-type polysilicon film is deposited to fill the second memory cell forming grooves 33M and the third wiring grooves 33 by using the LPCVD method, the N-type polysilicon film is etched back by the dry etching method. Therefore, the rectifying layer 35 having thickness of about 20 nanometers including the N-type polysilicon film is formed on the variable resistive layer 34 in the second memory cell forming grooves 33 (FIGS. 5N, 6N, 7N, and 8N). P or As can be implanted in the rectifying layer 35 as an N-type dopant by the ion implantation method and diffused by thermal treatment to form the N-type impurity high concentration diffusion layer 36 (FIGS. 5O, 6O, 7O, and 8O). The thickness of the formed N-type impurity high concentration diffusion layer 36 is, for example, 10 nanometers. Consequently, the thickness of the rectifying layer 35 is about 10 nanometers. This makes it possible to realize highly ohmic contact between third wires to be formed next and the N-type polysilicon film (the rectifying layer 35). In this way, the variable resistance memory cells MC in the second layer are formed.

The third wires 37 including the barrier metal film 371 such as a TiN film and the wiring material film 372 such as a W film is formed by the PVD method or the CVD method to fill the second memory cell forming grooves 33M and the third wiring grooves 33. The excess third wires 37 are removed by the CMP method until an upper surface of the silicon nitride film 32 is exposed. Consequently, the nonvolatile memory device shown in FIGS. 3A to 3D is obtained.

Figure 5B:
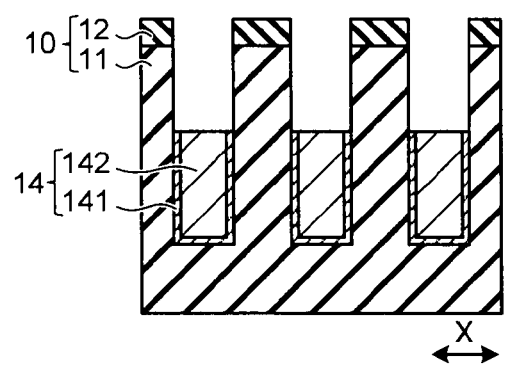
Figure 5C:
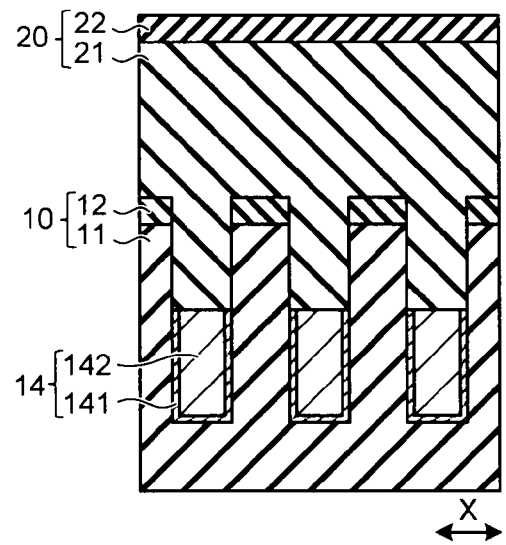
Figure 5D:
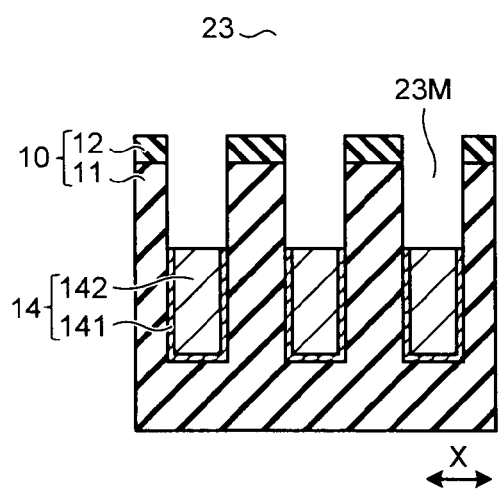
Figure 5E:
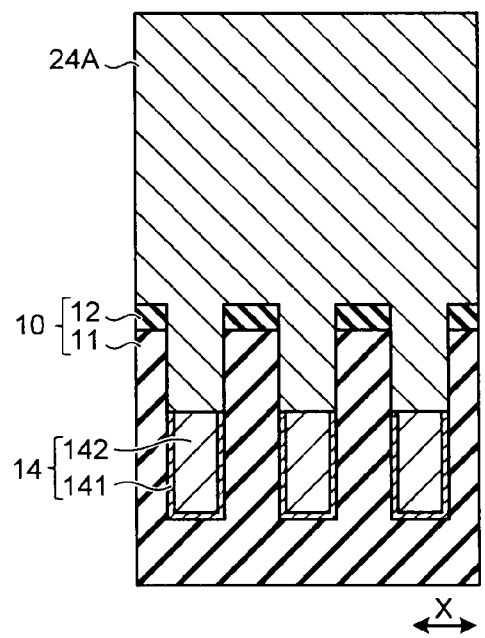
Figure 5F:
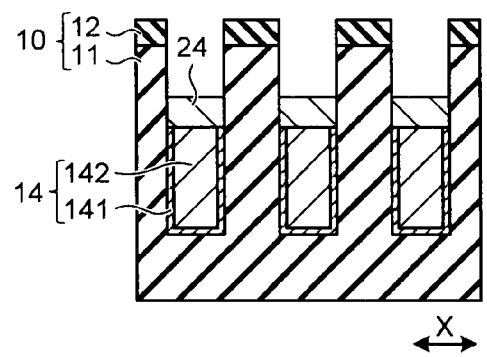
Figure 5G:
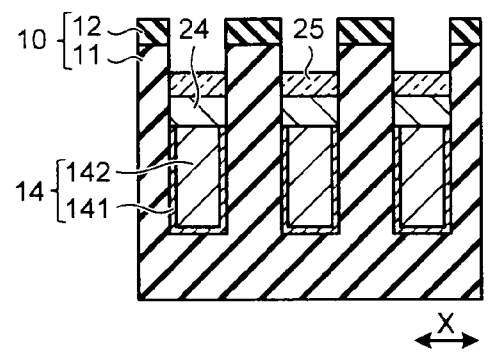
Figure 5H:
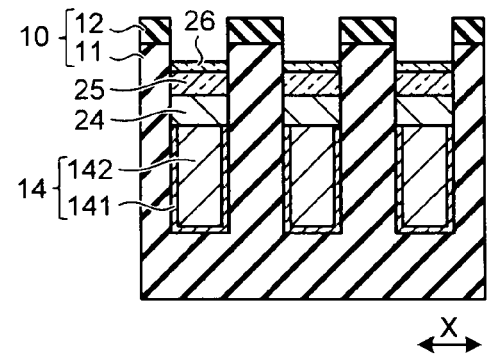
Figure 5I:
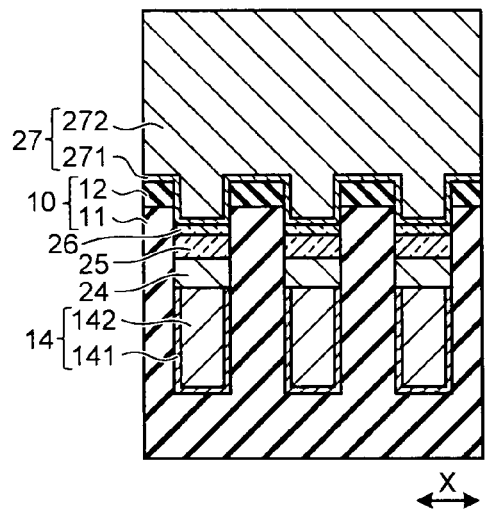
Figure 5J:
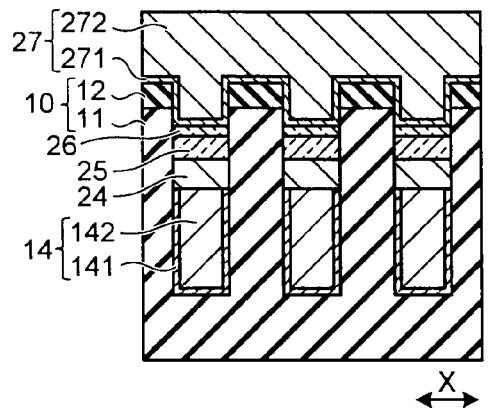
Figure 5K:
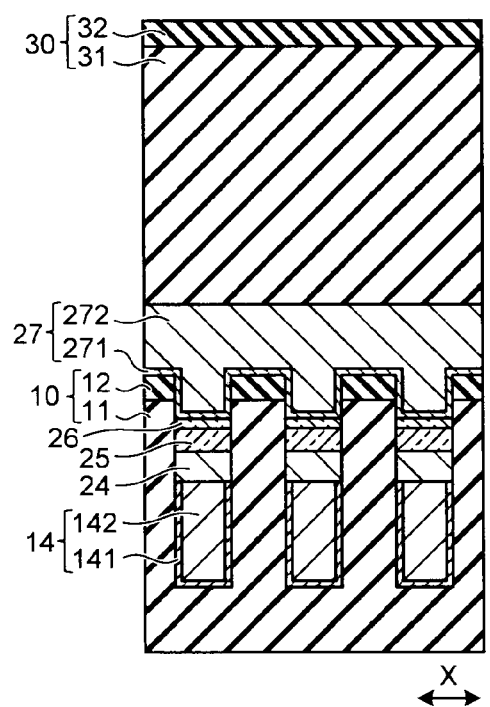

When desired, steps same as those shown in FIG. 5B (FIGS. 6B, 7B, and 8B) to FIG. 5I (FIGS. 6I, 7I, and 8I) and steps same as those shown in FIG. 5J (FIGS. 6J, 7J, and 8J) and subsequent steps are alternately repeated a plurality of times. Consequently, the variable resistance memory cells MC can be laminated in multiple layers and an increase in capacity can be realized even with the same chip area.

In the above explanation, the method of manufacturing the nonvolatile memory device having the structure in which the two or more layers of variable resistance memory cells MC are laminated is explained. However, when the variable resistance memory cells MC are provided in one layer, the thickness of the silicon oxide film 21 of the second interlayer insulating film 20 formed at the step shown in FIG. 5C (FIGS. 6C, 7C, and 8C) is halved to about 100 nanometers. Then, the processing from FIG. 5A (FIGS. 6A, 7A, and 8A) to FIG. 5I (FIGS. 6I, 7I, and 8I) is performed. In FIG. 5I (FIGS. 6I, 7I, and 8I), when the second wires 27 present on the upper surface of the silicon nitride film 22 are removed by the CMP method, the processing for manufacturing the nonvolatile memory device including the one layer of variable resistance memory cells MC finishes.

As explained above, according to the first embodiment, the variable resistive layers 24 and 34 and the rectifying layers 25 and 35 forming the variable resistance memory cells MC in the respective layers are embedded and formed in the grooves formed at the intersections of the lower layer wires and the upper layer wires of the variable resistance memory cells MC. Therefore, the sides of the resistance changing layers 24 and 34 and the rectifying layers 25 and 35 are not exposed to dry etching and wet processes. As a result, there is an effect that it is possible to suppress deterioration in characteristics caused when the sides of the variable resistive layers 24 and 34 and the rectifying layers 25 and 35 are exposed to the dry etching and wet processes.

The variable resistive layers 24 and 34 are formed after the silicon oxide films (the interlayer insulating films 10, 20, and 30), which insulate wires, are deposited. Therefore, the resistance change material is not oxidized when the silicon oxide films 11, 21, and 31 forming the interlayer insulating films 10, 20, and 30 are deposited. As a result, there is also an effect that it is possible to suppress deterioration in characteristics due to oxidation of the variable resistive layers 24 and 34.

Figure 5L:
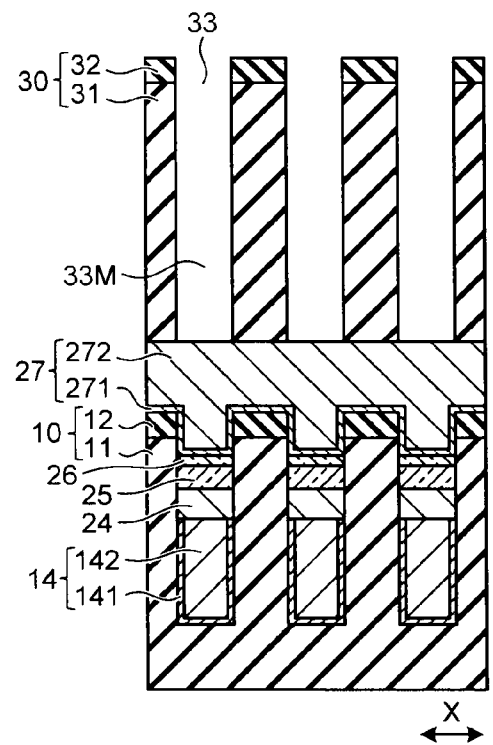

Further, for example, in the steps explained above, except the processes that the patterning is performed by the lithography to form the first to third wires 14, 27, and 37 in FIG. 5A (FIGS. 6A, 7A, and 8A), FIG. 5D (FIGS. 6D, 7D, and 8D), and FIG. 5L (FIGS. 6L, 7L, and 8L), the lithography process for forming the variable resistance memory cells MC is unnecessary. In this way, the variable resistance memory cells MC can be formed only by the patterning of wires without requiring the lithography process for forming the variable resistance memory cells MC. Therefore, there is an effect that manufacturing cost can be reduced.

FIGS. 9A to 12H are schematic sectional views of an example of a procedure of a method of manufacturing a nonvolatile memory device according to a second embodiment of the present invention. FIGS. 9A to 9H correspond to the A-A sectional view of FIG. 1, FIGS. 10A to 10H correspond to the B-B sectional view of FIG. 2, FIGS. 11A to 11H correspond to the C-C sectional view of FIG. 2, and FIGS. 12A to 12H correspond to the D-D sectional view of FIG. 2.

First, as explained with reference to FIG. 5A (FIGS. 6A, 7A, and 8A) and FIG. 5B (FIGS. 6B, 7B, and 8B) in the first embodiment, the silicon oxide film 11 having thickness of, for example, about 300 nanometers and the silicon nitride film 12 having thickness of, for example, about 20 nanometers are laminated on a not-shown semiconductor substrate such as an Si substrate, on which a CMOS logic circuit is formed, to form the first interlayer insulating film 10. Subsequently, the first wiring grooves 13 having depth of, for example, 200 nanometers is formed in the silicon nitride film 12 and the silicon oxide film 11 by the lithography technique and the etching technology. Thereafter, the first wires 14 including the barrier metal film 141 such as a TiN film and the wiring material film 142 such as a W film are formed in the first wiring grooves 13 by the PVD method or the CVD method. After the first wires 14 formed on the silicon nitride film 12 are removed by the CMP method until the silicon nitride film 12 is exposed, the first wires 14 are etched back with thickness of, for example, 100 nanometers by the dry etching method.

The silicon oxide film 21 is deposited on the entire surface of the first interlayer insulating film 10 by the CVD method to fill the recessed first wiring grooves 13 and subsequently a silicon nitride film 22A is deposited to form the second interlayer insulating film 20 (FIGS. 9A, 10A, 11A, and 12A). The silicon nitride film 22A is desirably formed thicker than the silicon nitride film 12 and more desirably formed with thickness twice or more as large as the thickness of the silicon nitride film 12. For example, the silicon oxide film 21 is formed with thickness of about 200 nanometers from the upper surface of the silicon nitride film 12 and the silicon nitride film 22A is formed with thickness of 40 nanometers.

As in the first embodiment, resist is applied on the silicon nitride film 22A. Patterning is performed by the lithography technique such that opening patterns extending in the X direction are formed at predetermined intervals in the Y direction. Etching of the silicon nitride film 22A and the silicon oxide film 21 is performed with the patterned resist film as a mask (FIGS. 9B, 10B, 11B, and 12B). When the etching of the silicon oxide film 21 is performed, under a condition that the silicon oxide film 21 is more easily etched than the silicon nitride film 12 and a condition that the silicon oxide film 21 is more easily etched than the first wires 14 (the TiN film and the W film), the etching of the silicon oxide film 21 is performed, until an upper surface of the first wires 14 is exposed, in an area in which the silicon nitride film 12 is not formed. Consequently, the second wiring grooves 23 are formed in an area higher than the silicon nitride film 12. In an area in which the silicon nitride film 12 is not formed, and in an area lower than the silicon nitride film 12, the first memory cell forming grooves 23M specified by the width of the first wiring grooves 13 and the second wiring grooves 23 are formed.

Thereafter, under a condition that the silicon nitride film 12 is more easily etched than the first wires 14 (the TiN film and the W film) and a condition that the silicon nitride film 12 is more easily etched than the silicon oxide film 11, the silicon nitride film 12 is etched and removed by the dry etching method until the upper surface of the silicon oxide film 11 is exposed in an area in which the second interlayer insulating film 20 is not formed (FIGS. 9C, 10C, 11C, and 12C). The silicon nitride film 22A is prevented from being entirely etched. The silicon nitride film 22A is etched simultaneously with the etching of the silicon nitride film 12. However, the silicon nitride film 22A is formed thicker than the silicon nitride film 12. Therefore, the silicon nitride film 22A can be left by stopping the etching at a point when the silicon nitride film 12 is etched.

As explained with reference to FIG. 5E (FIGS. 6E, 7E, and 8E) to FIG. 5J (FIGS. 6J, 7J, and 8J) in the first embodiment, the variable resistance memory cells MC are formed in which the variable resistive layer 24 including an NiO film having thickness of, for example 10 nanometers, the rectifying layer 25 including the P-type polysilicon film having thickness of, for example, 10 nanometers, and the P-type impurity high concentration diffusion layer 26 having thickness of, for example, 10 nanometers, in which a P-type impurity is diffused at high density, are laminated in order. The second wires 27 including the barrier metal film 271 such as a TiN film and the wiring material film 272 such as a W film are formed to fill about a half of the first memory cell forming grooves 23M and the second wiring grooves 23 (FIGS. 9D, 10D, 11D, and 12D).

Thereafter, the silicon oxide film 31 is deposited over the entire surface of the second interlayer insulting film 20 by the CVD method to fill the recessed second wiring grooves 23 and subsequently a silicon nitride film 32A thicker than the silicon nitride film 22A left by the etching shown in FIGS. 9C, 10C, 11C, and 12C is deposited to form the third interlayer insulating film 30 (FIGS. 9E, 10E, 11E, and 12E). For example, the silicon oxide film 31 is formed with thickness of about 200 nanometers from an upper surface of the silicon nitride film 22A. The silicon nitride film 32A is formed with thickness of 40 nanometers.

As in the case of the second wires 27, resist is applied on the silicon nitride film 32A. Patterning is performed by the lithography technique such that opening patterns extending in the Y direction are formed at predetermined intervals in the X direction. Etching of the silicon nitride film 32A and the silicon oxide film 31 is performed with the patterned resist film as a mask (FIGS. 9F, 10F, 11F, and 12F). When the etching of the silicon oxide film 31 is performed, under a condition that the silicon oxide film 31 is more easily etched than the silicon nitride film 22A and a condition that the silicon oxide film 31 is more easily etched than the second wires 27 (the TiN film and the W film), the etching of the silicon oxide film 31 is performed, until an upper surface of the second wires 27 is exposed, in an area in which the silicon nitride film 22A is not formed. Consequently, the third wiring grooves 33 are formed in an area higher than the silicon nitride film 22A. In an area in which the silicon nitride film 22A is not formed, and in an area lower than the silicon nitride film 22A, the second memory cell forming grooves 33M specified by the width of the second wiring grooves 23 and the third wiring grooves 33 are formed.

Thereafter, under a condition that the silicon nitride film 22A is more easily etched than the second wires 27 (the TiN film and the W film) and a condition that the silicon nitride film 22A is more easily etched than the silicon oxide film 21, the silicon nitride film 22A is etched and removed by the dry etching method until the upper surface of the silicon oxide film 21 is exposed in an area in which the third interlayer insulating film 30 is not formed (FIGS. 9G, 10G, 11G, and 12G). The silicon nitride film 32A is prevented from being entirely etched. The silicon nitride film 32A is etched simultaneously with the etching of the silicon nitride film 22A. However, the silicon nitride film 32A is formed thicker than the silicon nitride film 22A. Therefore, the silicon nitride film 32A can be left by stopping the etching at a point when the silicon nitride film 22A is etched.

Figure 5M:
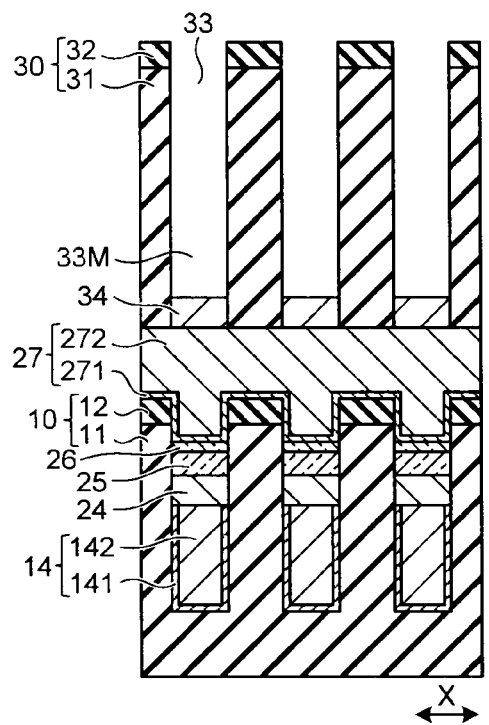
Figure 5N:
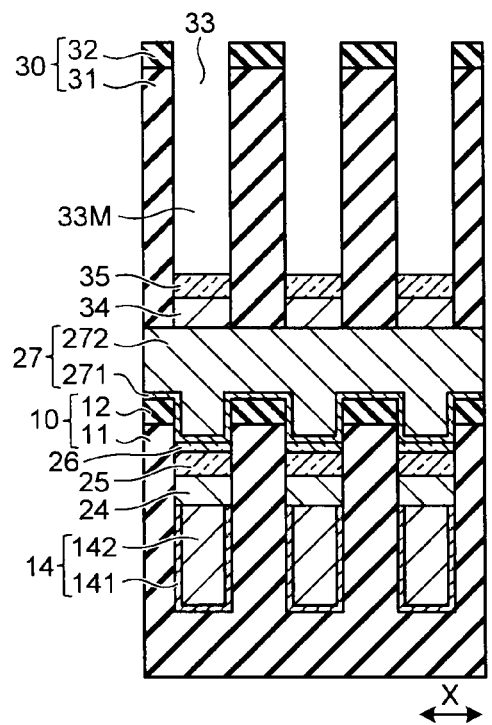
Figure 5O:
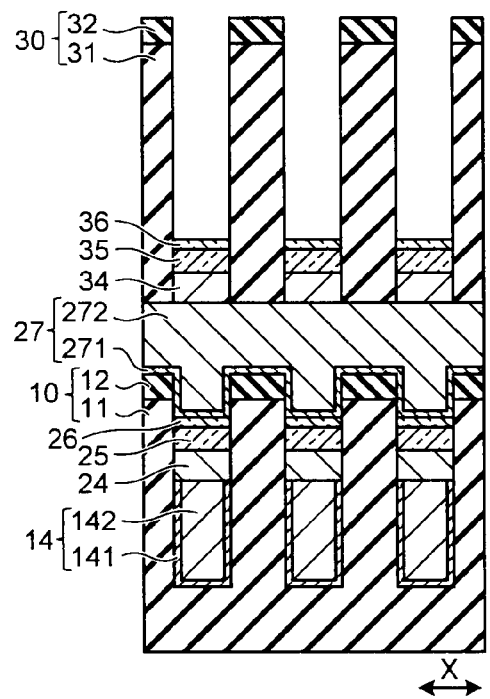
Figure 6A:
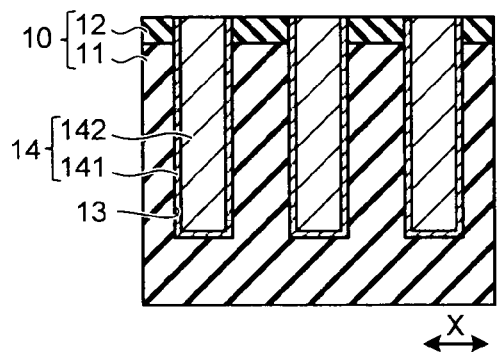
FIGS. 6A to 6O are schematic sectional views corresponding to the B-B section shown in FIG. 2 for explaining the example of the procedure of the method of manufacturing a nonvolatile memory device according to the first embodiment.
Figure 6B:
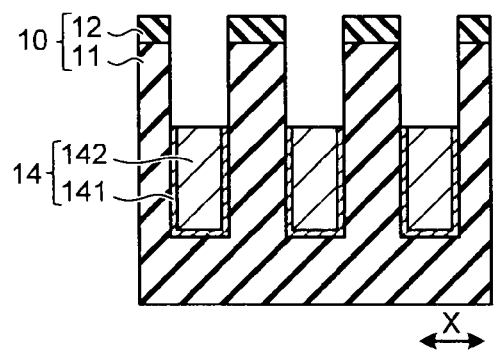
Figure 6C:
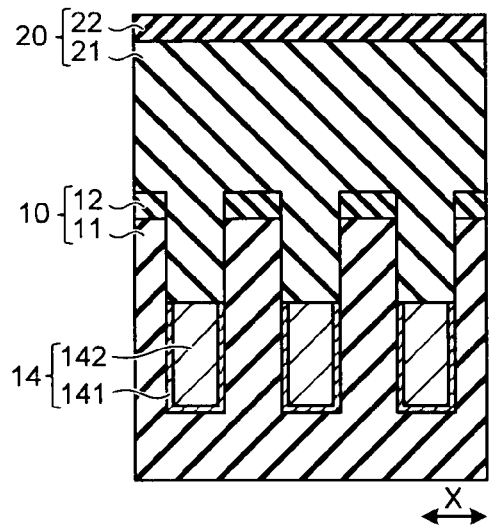
Figure 6D:
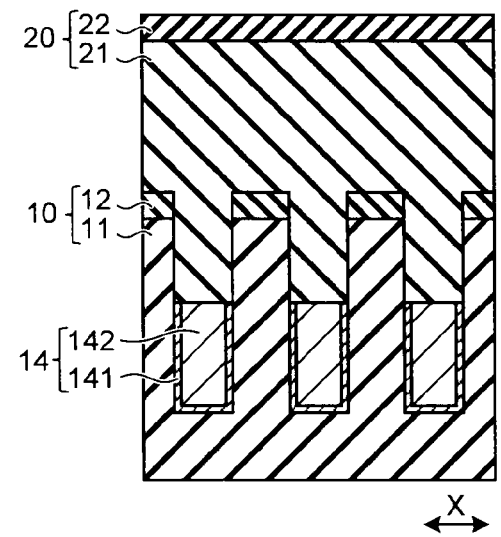
Figure 6E:
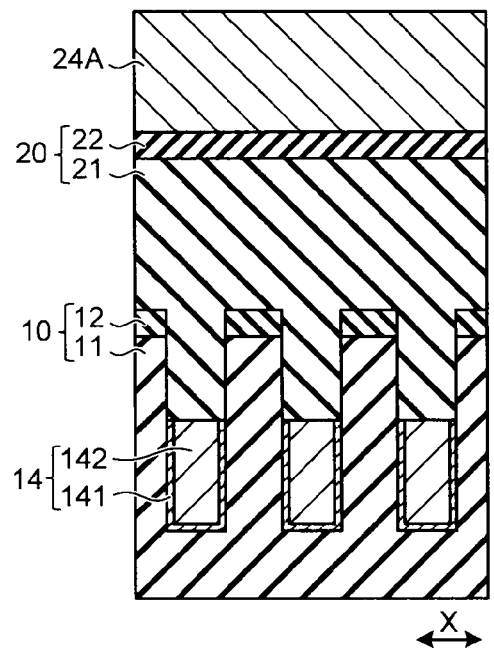
Figure 6F:
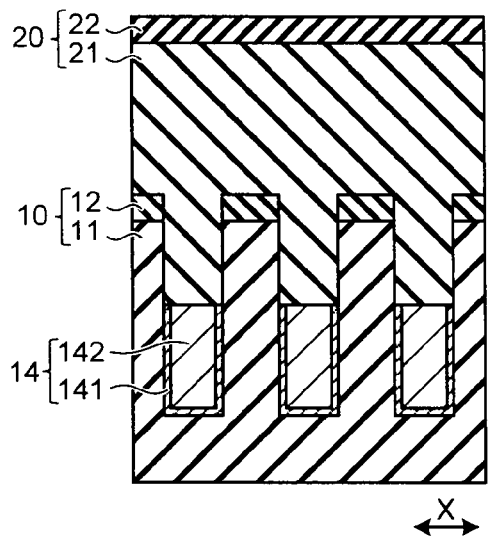
Figure 6G:
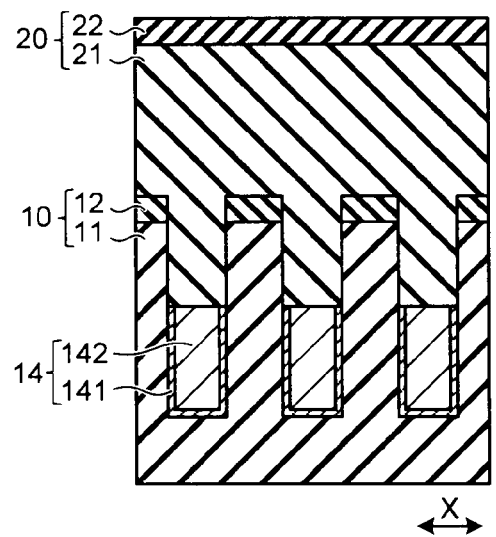
Figure 6H:
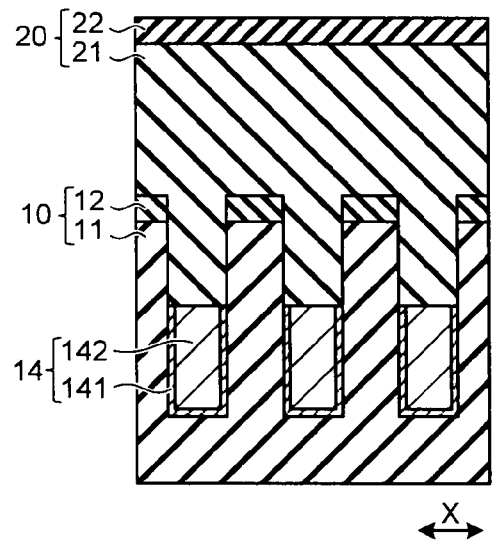
Figure 6I:
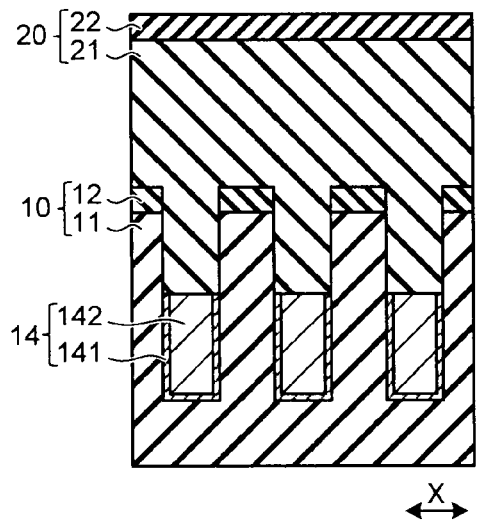
Figure 6J:
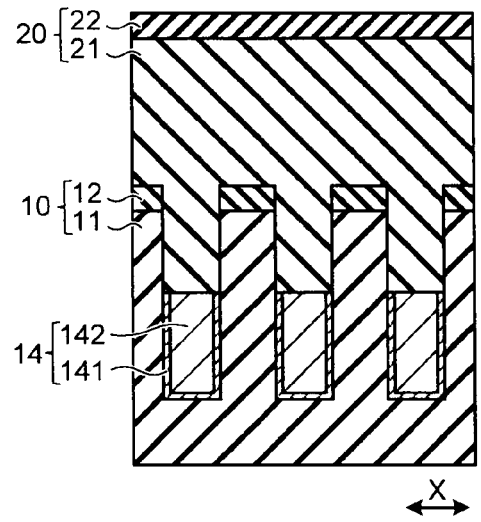
Figure 6K:
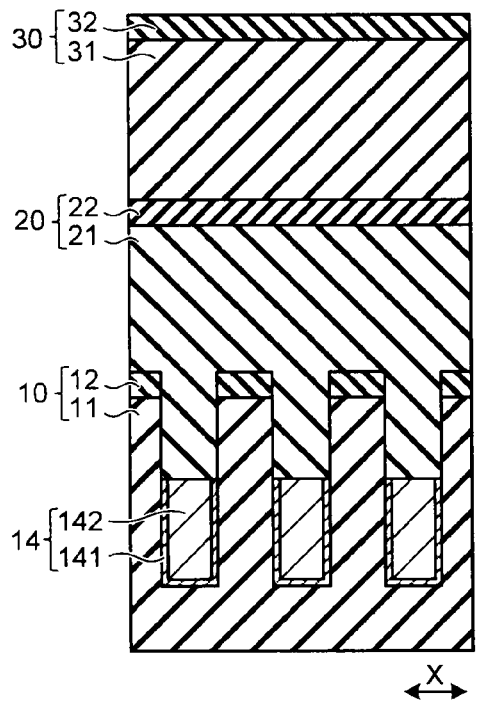
Figure 6L:
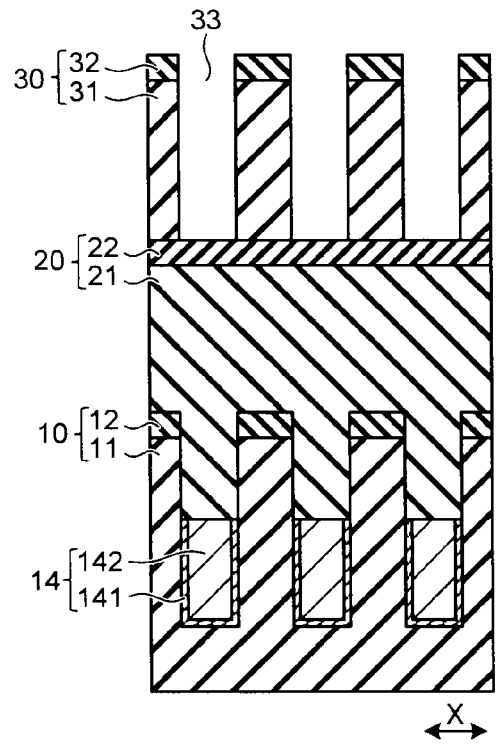
Figure 6M:
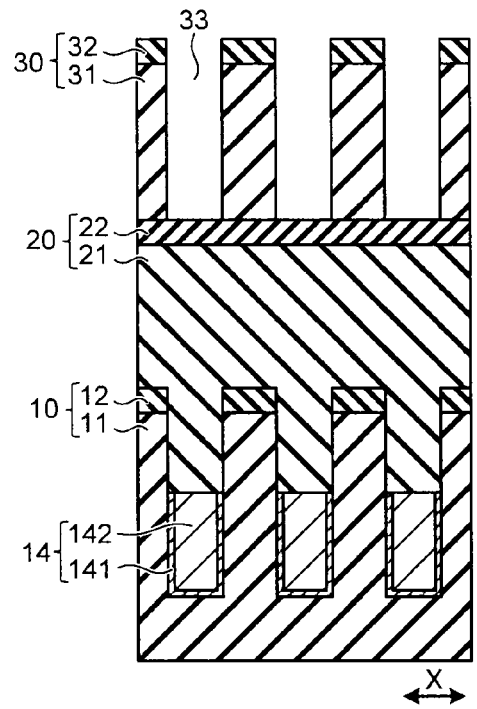
Figure 6N:
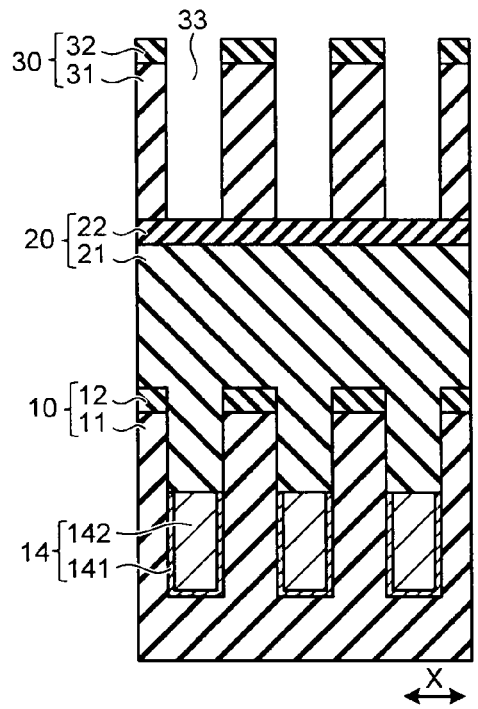
Figure 6O:
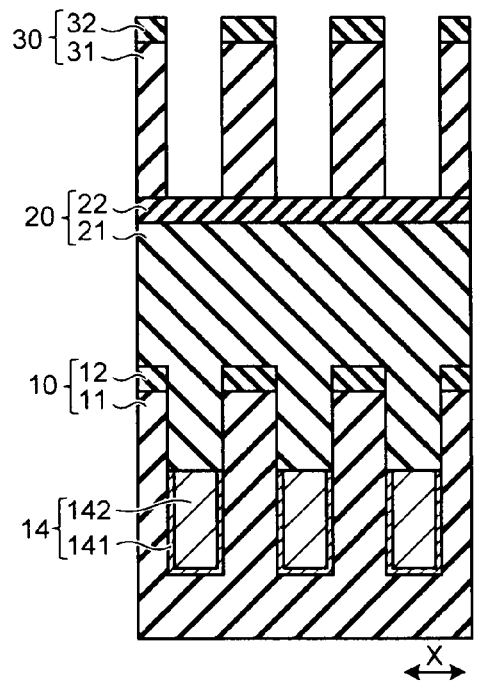
Figure 7A:
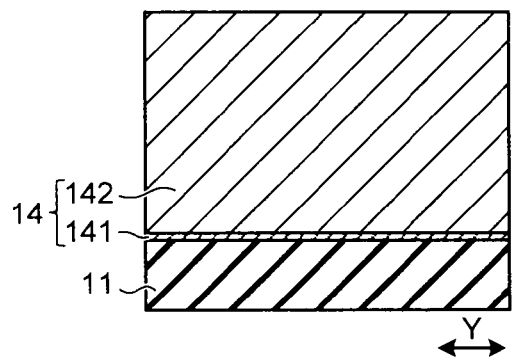
FIGS. 7A to 7O are schematic sectional views corresponding to the C-C section shown in FIG. 2 for explaining the example of the procedure of the method of manufacturing a nonvolatile memory device according to the first embodiment.
Figure 7B:
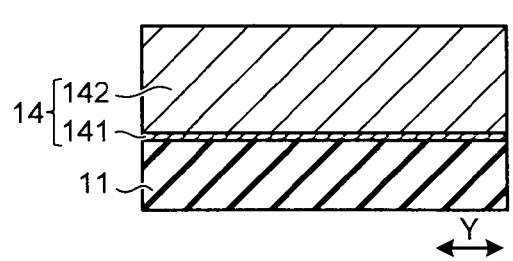
Figure 7C:
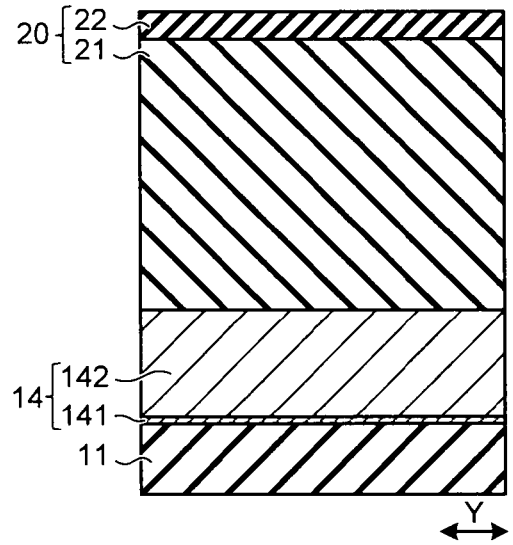
Figure 7D:
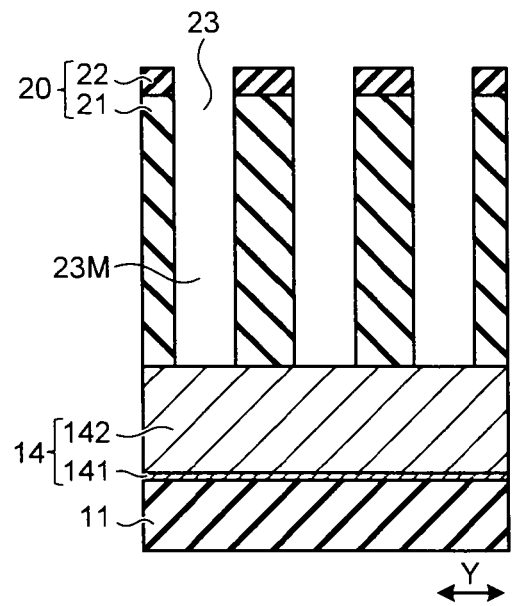
Figure 7E:
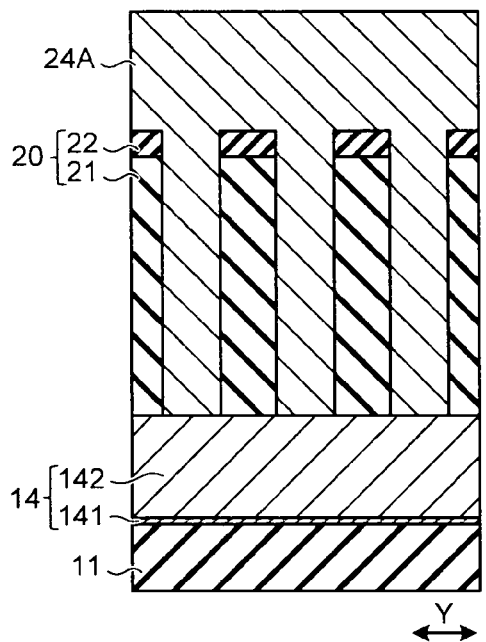
Figure 7F:
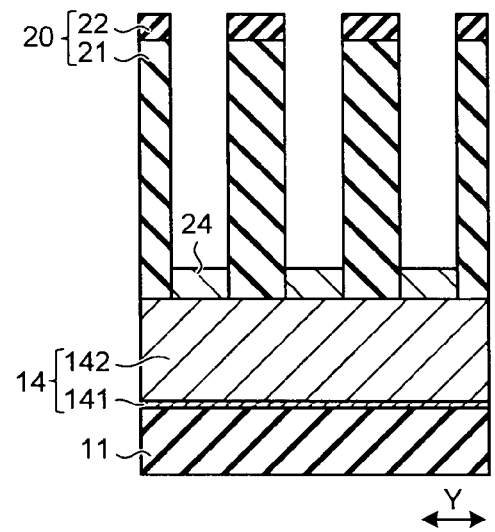
Figure 7G:
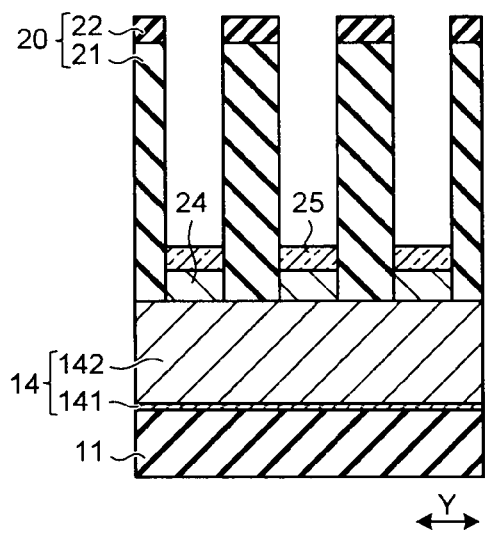
Figure 7H:
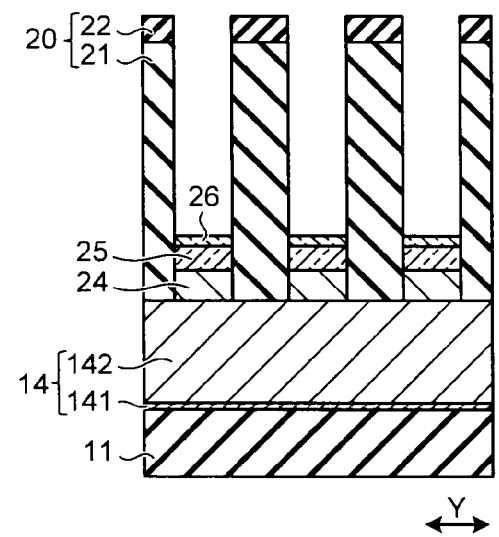
Figure 7I:
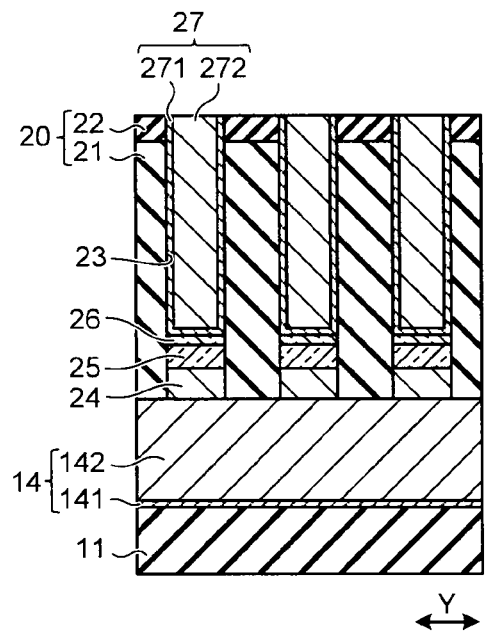
Figure 7J:
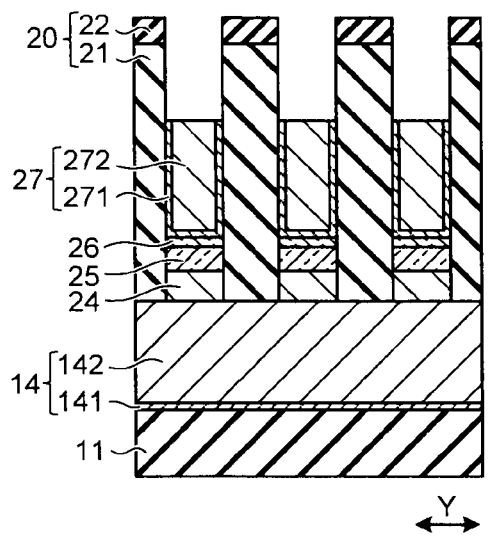
Figure 7K:
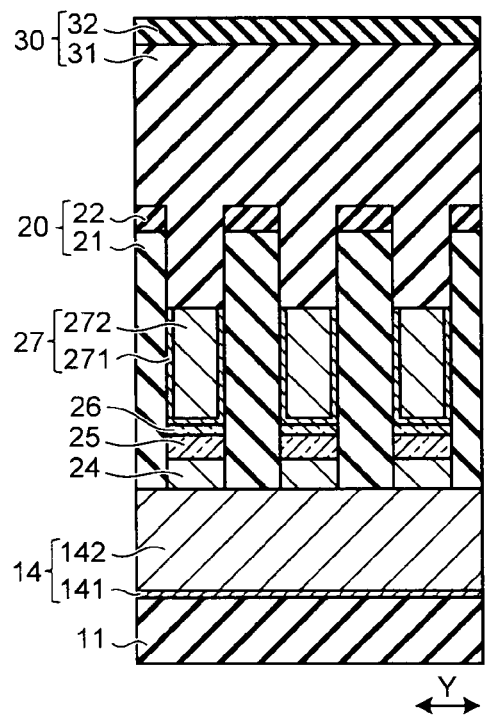
Figure 7L:
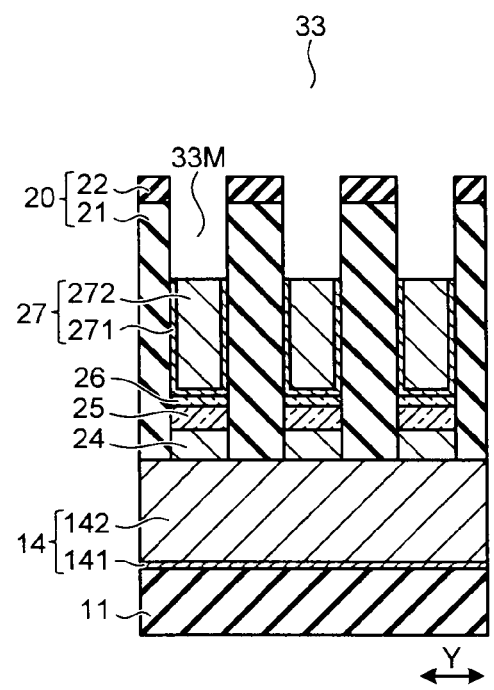
Figure 7M:
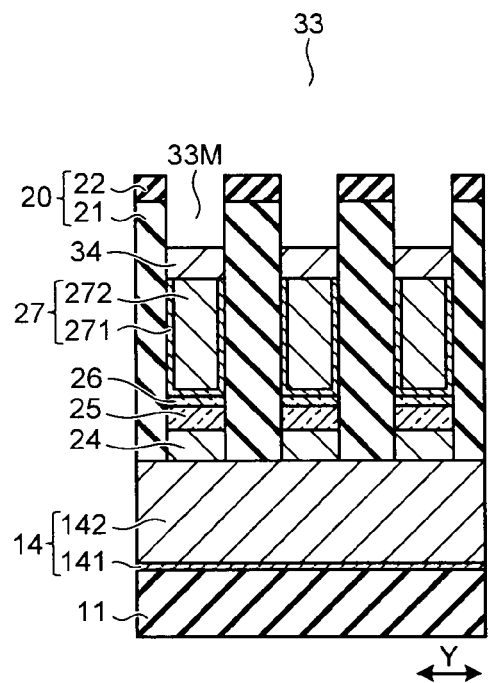
Figure 7N:
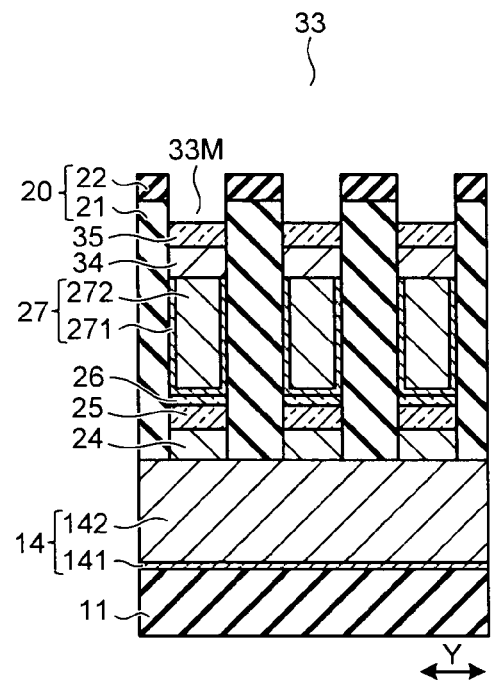
Figure 7O:
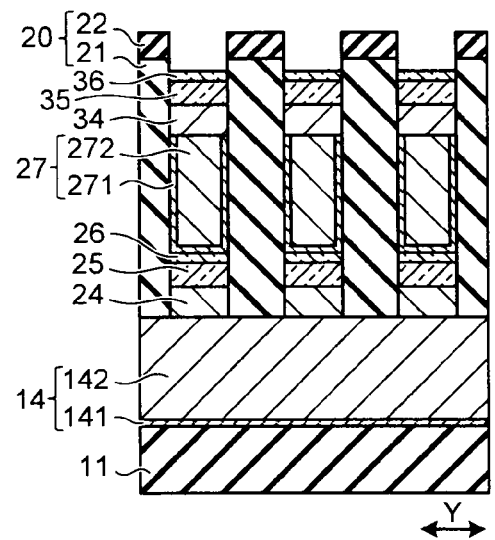
Figure 8A:
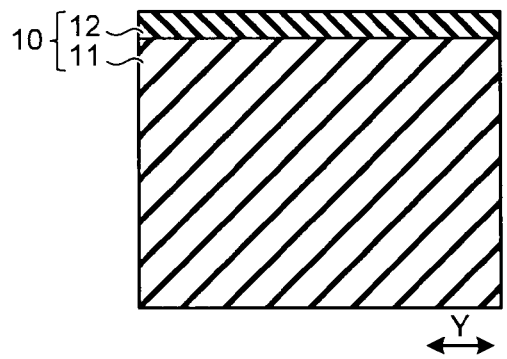
FIGS. 8A to 8O are schematic sectional views corresponding to the D-D section shown in FIG. 2 for explaining the example of the procedure of the method of manufacturing a nonvolatile memory device according to the first embodiment.
Figure 8B:
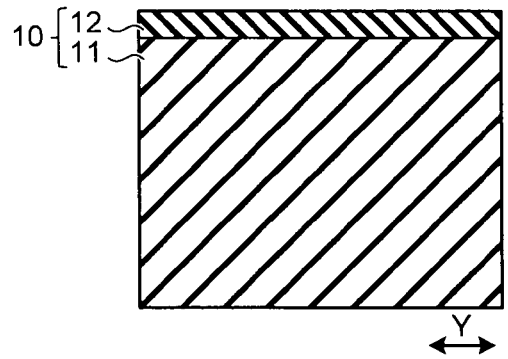
Figure 8C:
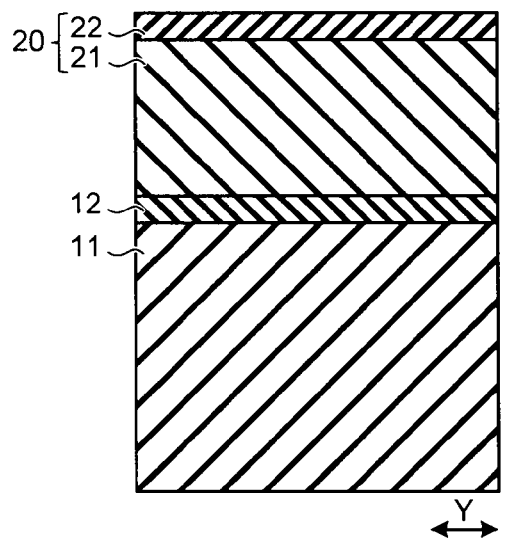
Figure 8D:
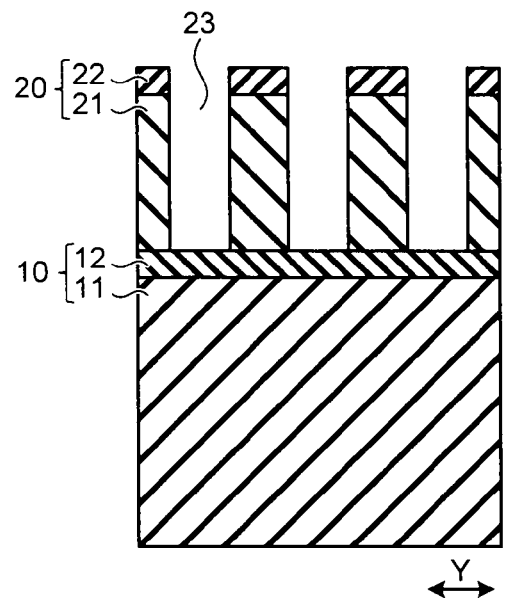
Figure 8E:
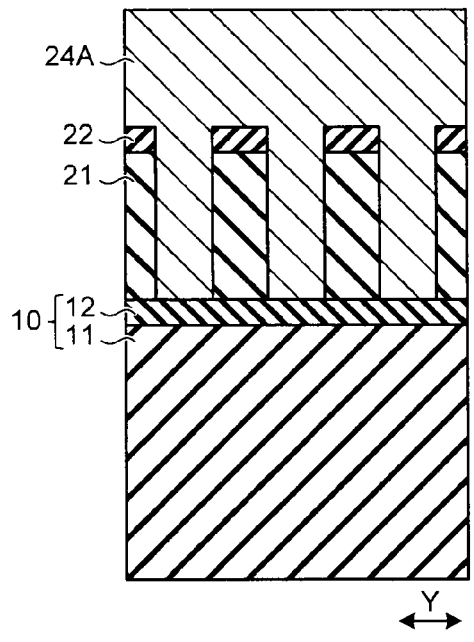
Figure 8F:
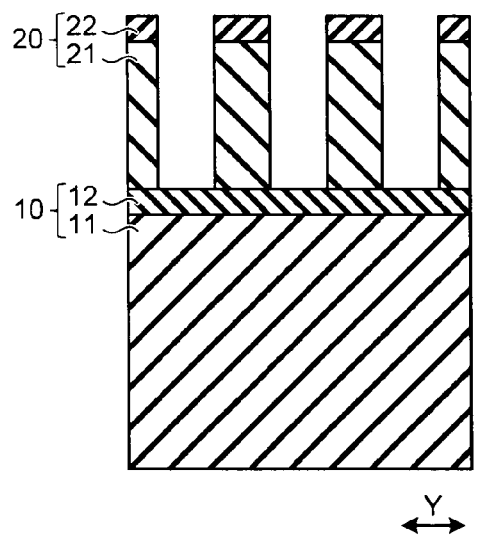
Figure 8G:
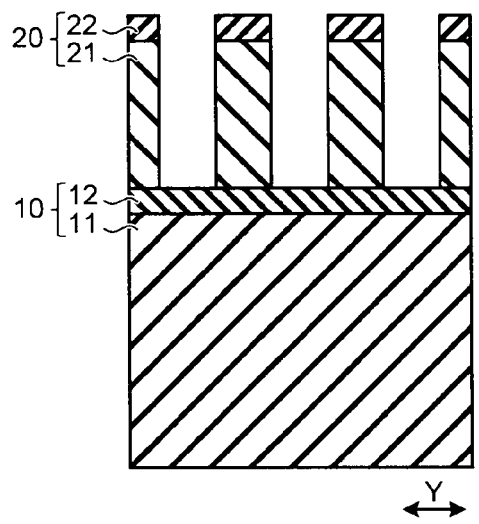
Figure 8H:
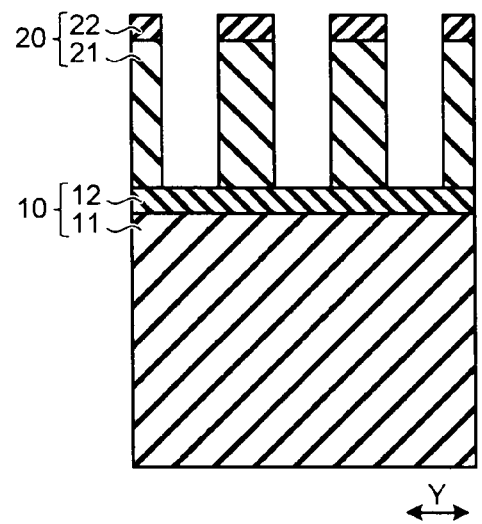
Figure 8I:
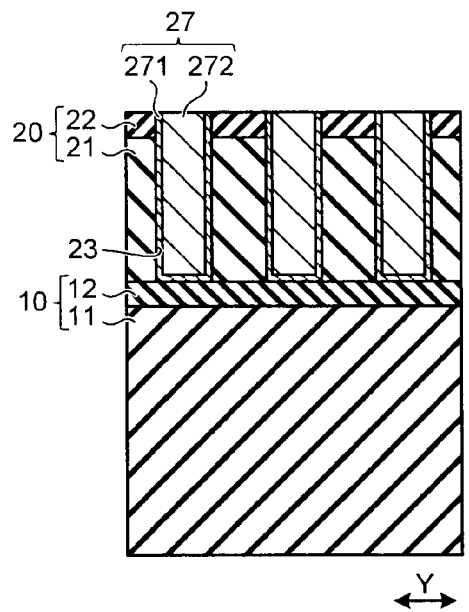
Figure 8J:
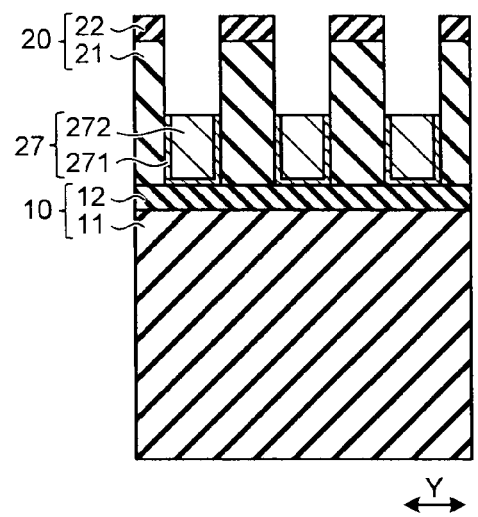
Figure 8K:
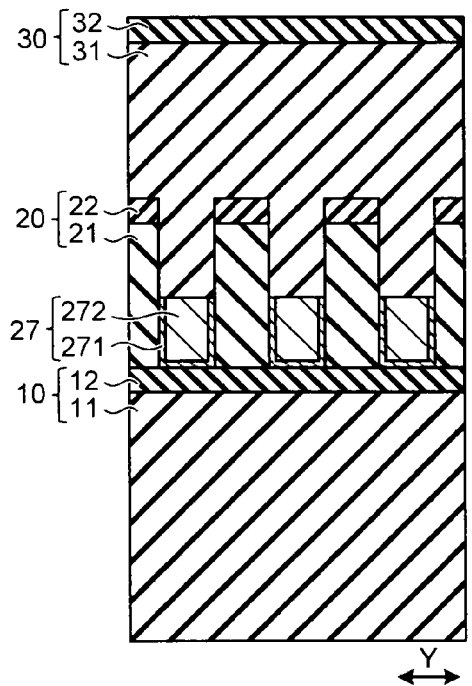
Figure 8L:
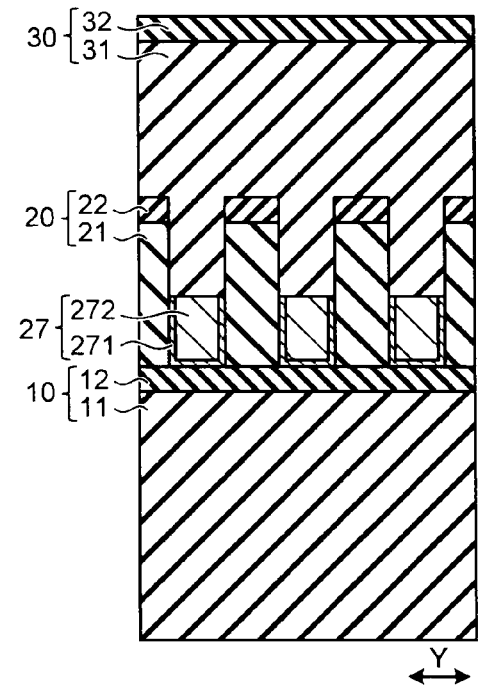
Figure 8M:
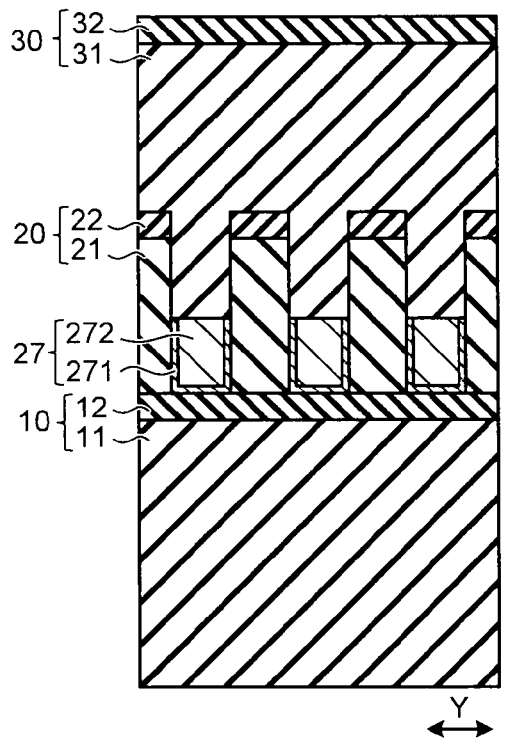
Figure 8N:
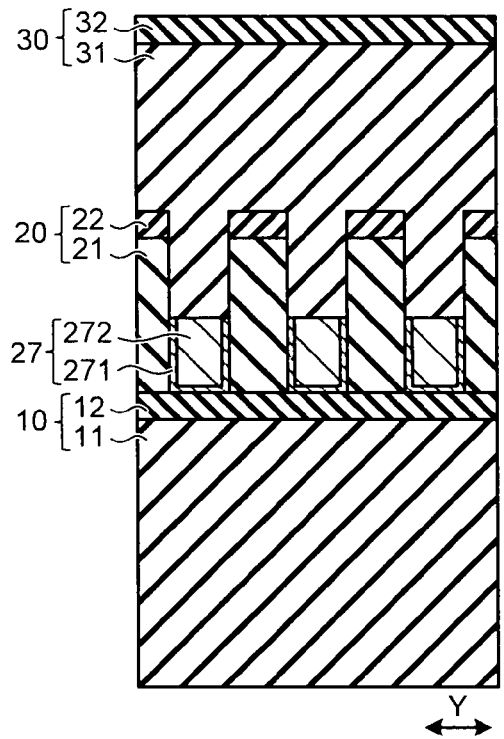
Figure 8O:
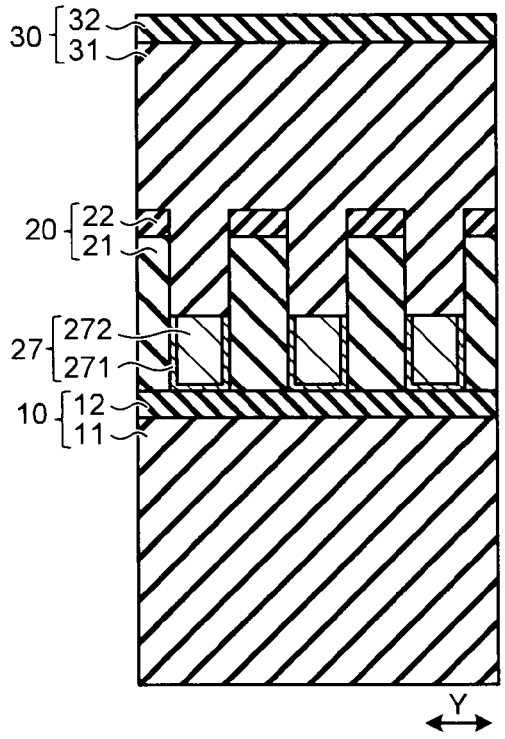

As explained with reference to FIG. 5M (FIGS. 6M, 7M, and 8M) to FIG. 5O (FIGS. 6O, 7O, and 8O) in the first embodiment, the variable resistance memory cells MC are formed in which the variable resistive layer 34 including an NiO film having thickness of, for example 10 nanometers, the rectifying layer 35 including the N-type polysilicon film having thickness of, for example, 10 nanometers, and the N-type impurity high concentration diffusion layer 36 having thickness of, for example, 10 nanometers, in which an N-type impurity is diffused at high density, are laminated in order. The third wires 37 including the barrier metal film 371 such as a TiN film and the wiring material film 372 such as a W film are formed to fill the second memory cell forming grooves 33M and the third wiring grooves 33 (FIGS. 9H, 10H, 11H, and 12H).

When desired, steps same as those shown in FIG. 9A (FIGS. 10A, 11A, and 12A) to FIG. 9D (FIGS. 10D, 11D, and 12D) and steps same as those shown in FIG. 9E (FIGS. 10E, 11E, and 12E) to FIG. 9H (FIGS. 10H, 11H, and 12H) are alternately repeated a plurality of times. Consequently, the variable resistance memory cells MC can be laminated in multiple layers and an increase in capacity can be realized even with the same chip area.

Figure 9A:
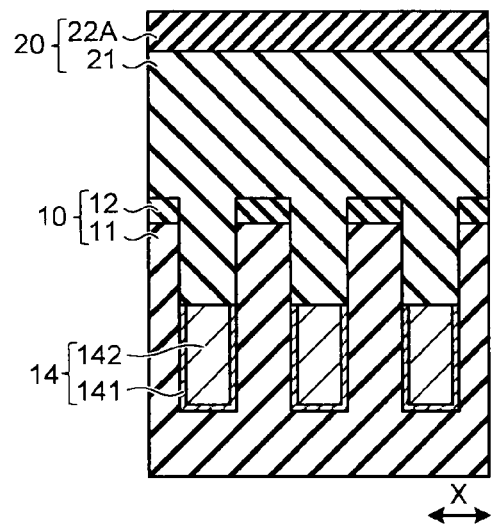
FIGS. 9A to 9H are schematic sectional views corresponding to the A-A section shown in FIG. 2 for explaining an example of a procedure of a method of manufacturing a nonvolatile memory device according to a second embodiment of the present invention.
Figure 9B:
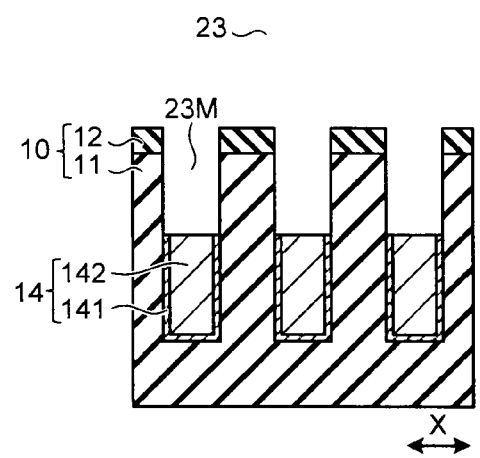
Figure 9C:
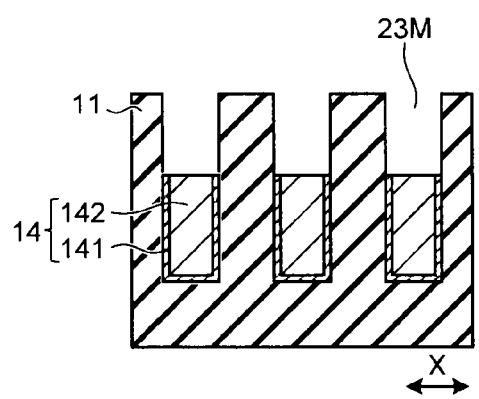
Figure 9D:
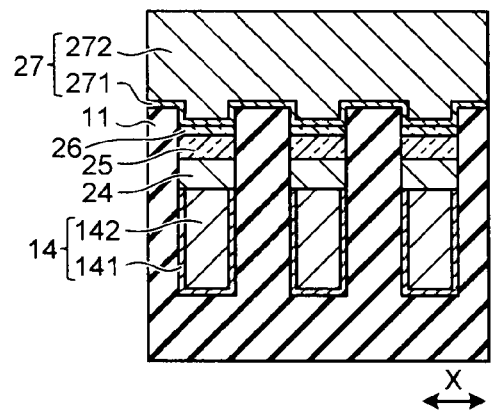
Figure 9E:
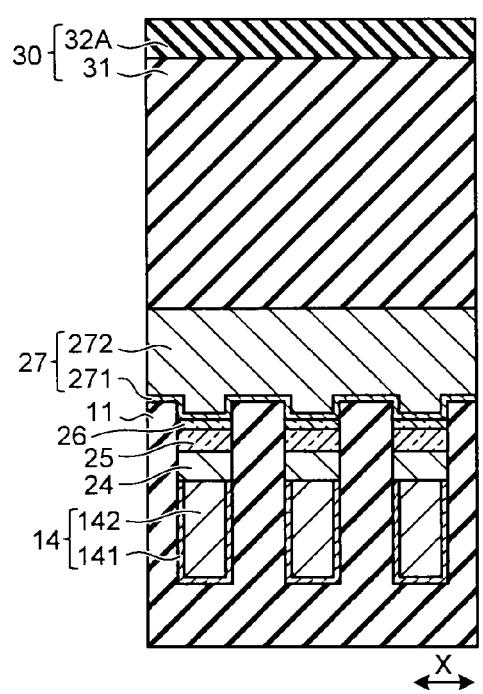
Figure 9F:
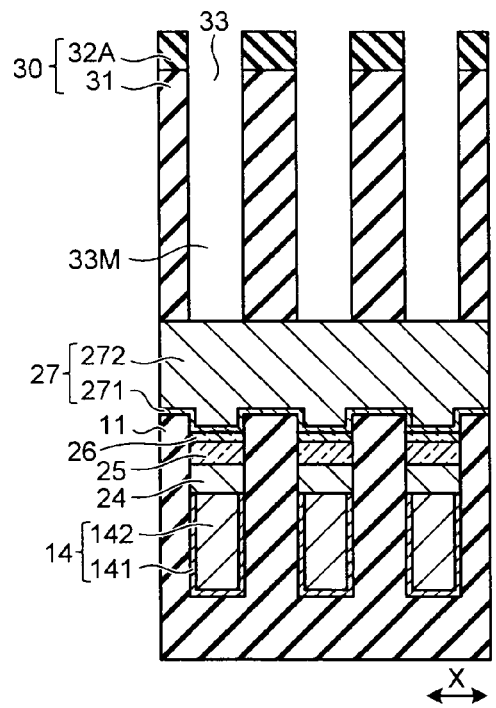
Figure 9G:
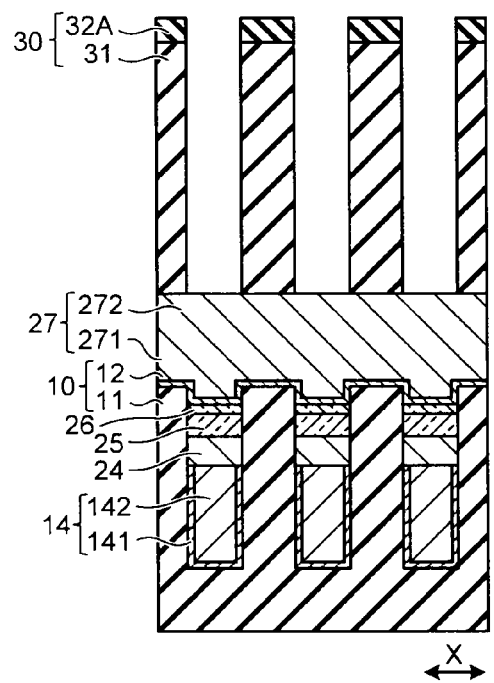
Figure 9H:
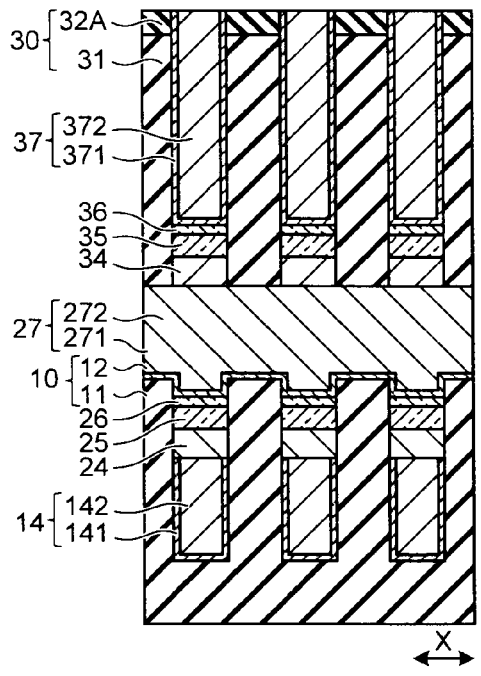
Figure 10A:
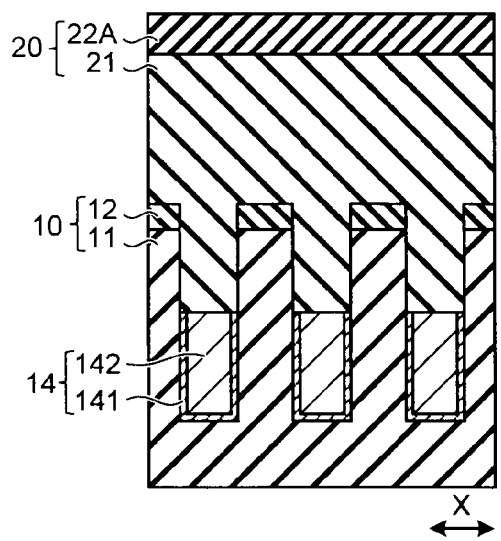
FIGS. 10A to 10H are schematic sectional views corresponding to the B-B section shown in FIG. 2 for explaining the example of the procedure of the method of manufacturing a nonvolatile memory device according to the second embodiment.
Figure 10B:
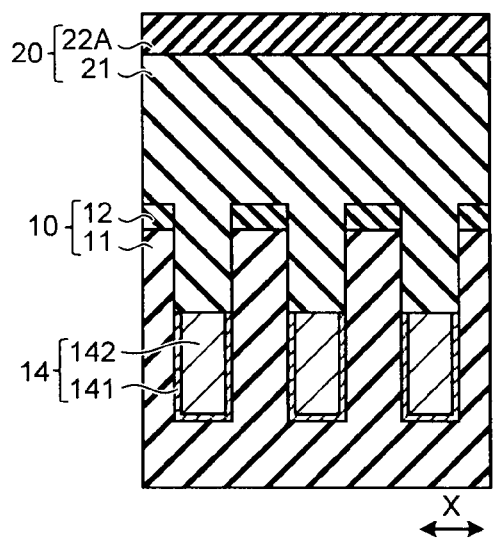
Figure 10C:
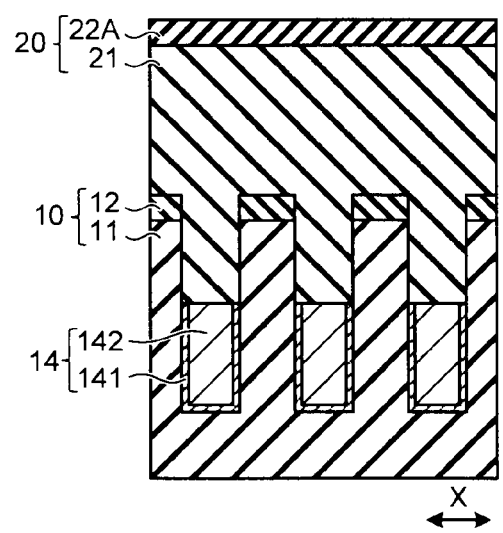
Figure 10D:
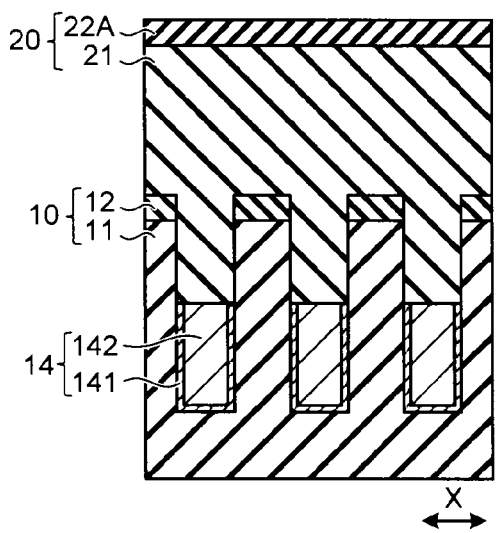
Figure 10E:
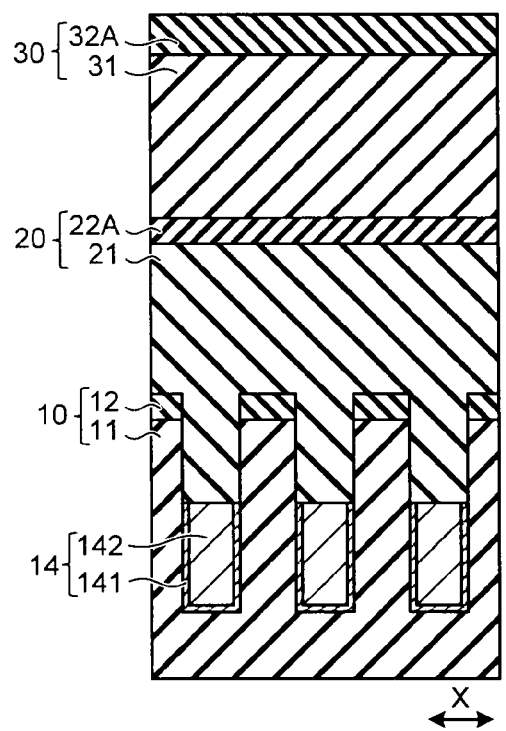
Figure 10F:
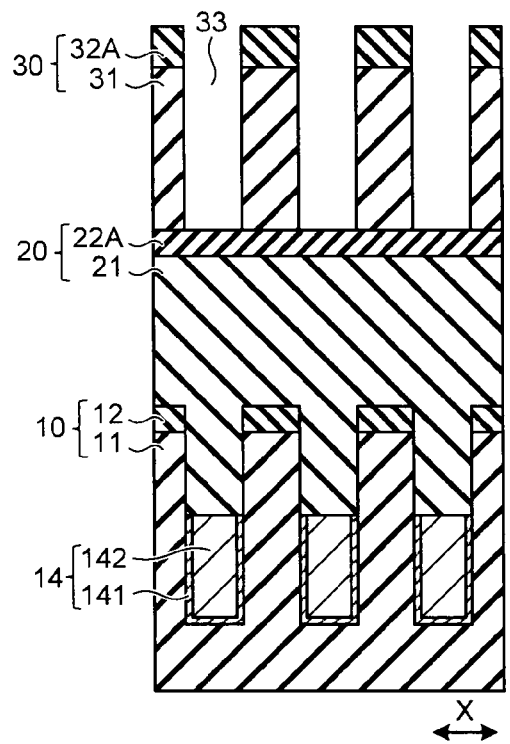
Figure 10G:
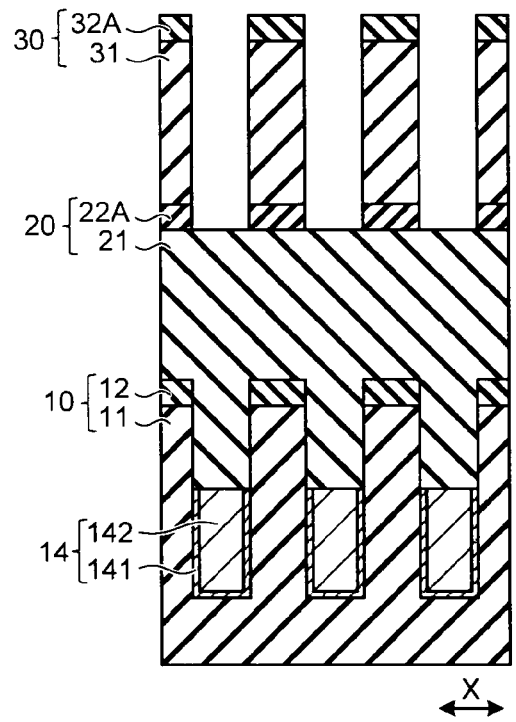
Figure 10H:
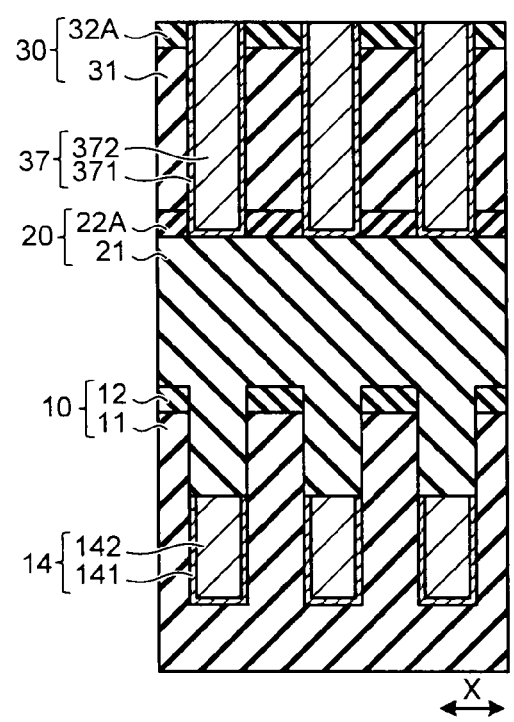
Figure 11A:
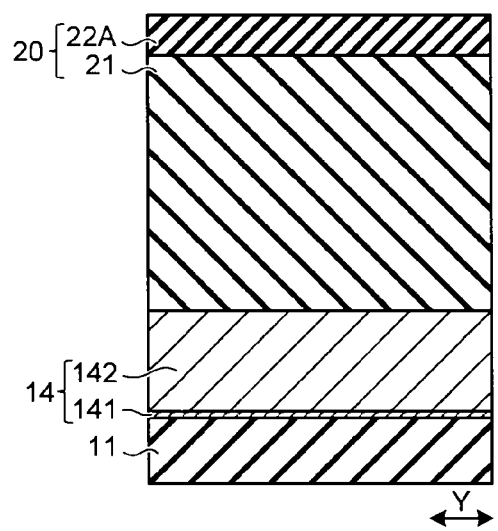
FIGS. 11A to 11H are schematic sectional views corresponding to the C-C section shown in FIG. 2 for explaining the example of the procedure of the method of manufacturing a nonvolatile memory device according to the second embodiment.
Figure 11B:
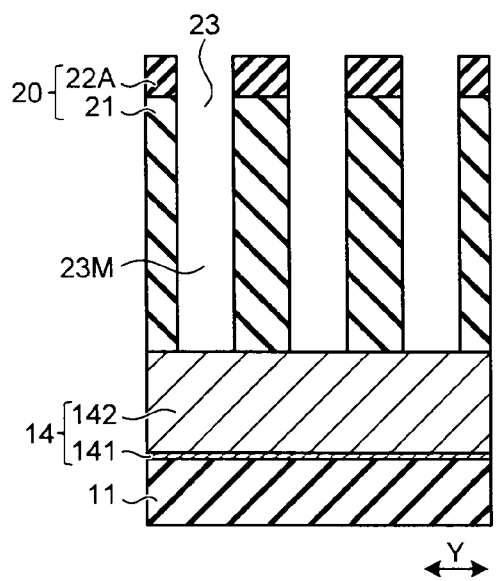
Figure 11C:
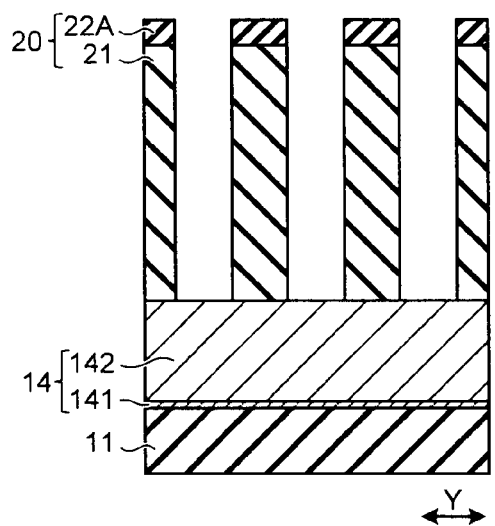
Figure 11D:
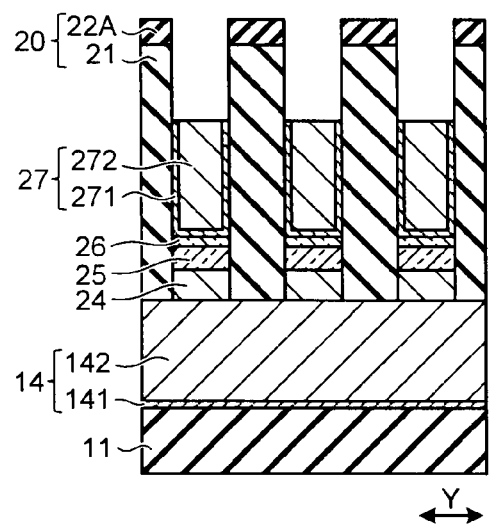
Figure 11E:
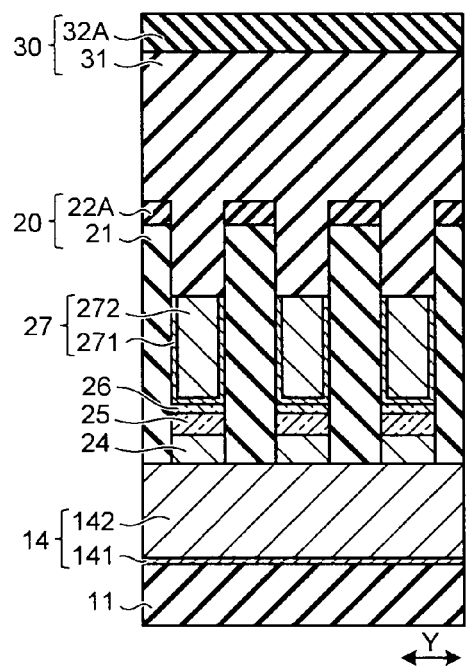
Figure 11F:
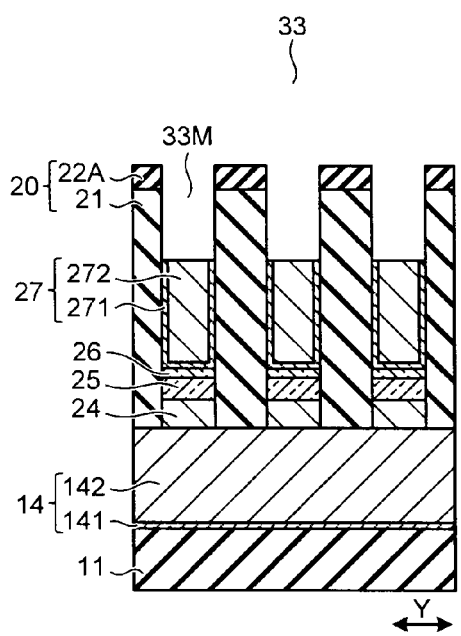
Figure 11G:
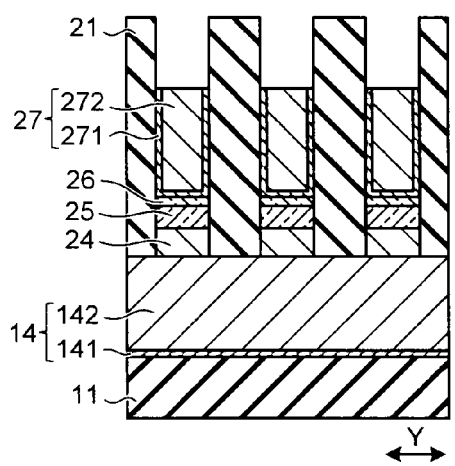
Figure 11H:
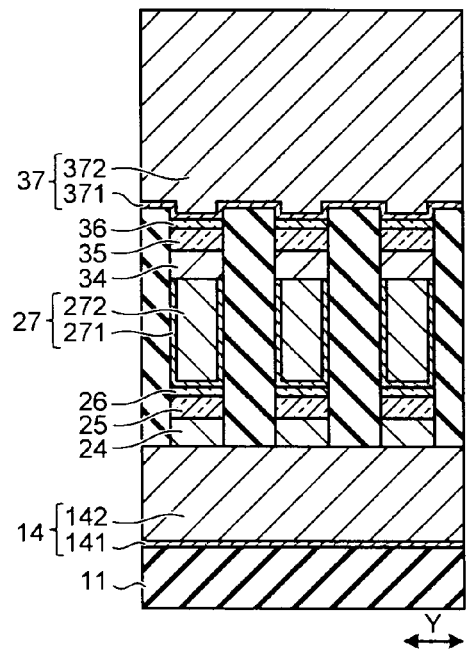
Figure 12A:
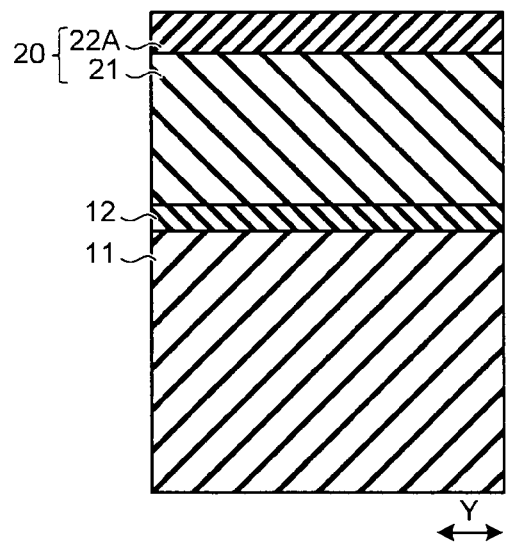
FIGS. 12A to 12H are schematic sectional views corresponding to the D-D section shown in FIG. 2 for explaining the example of the procedure of the method of manufacturing a nonvolatile memory device according to the second embodiment.
Figure 12B:
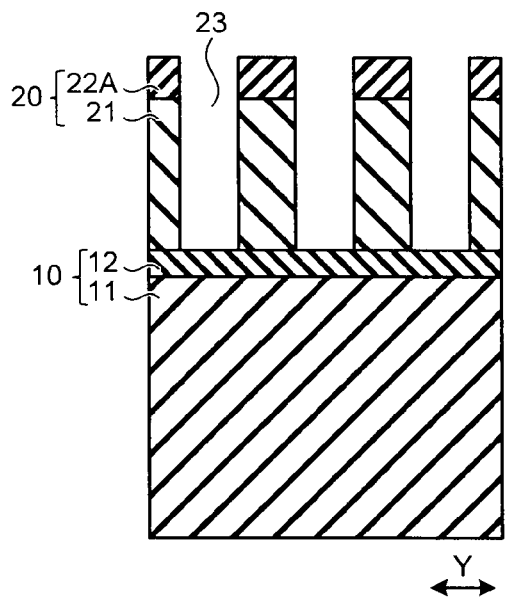
Figure 12C:
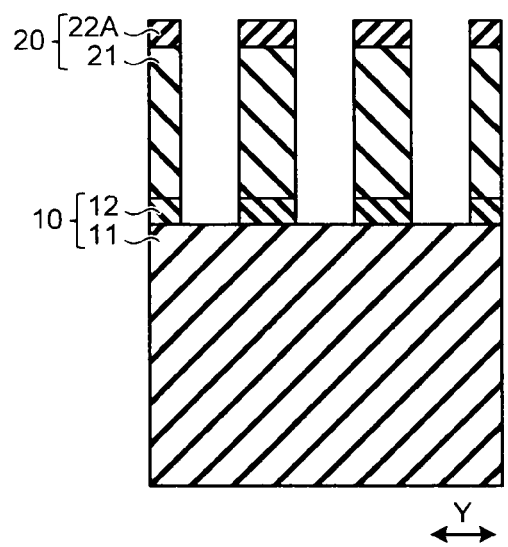
Figure 12D:
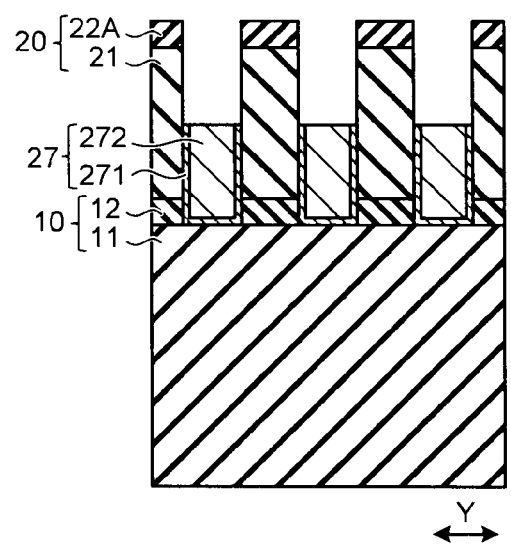
Figure 12E:
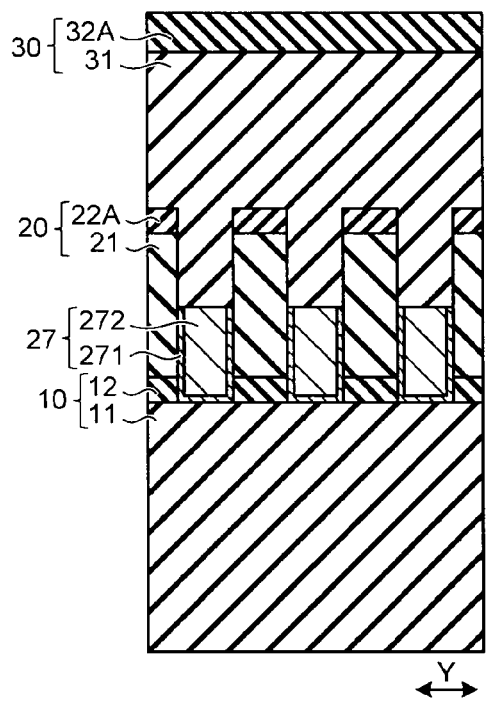
Figure 12F:
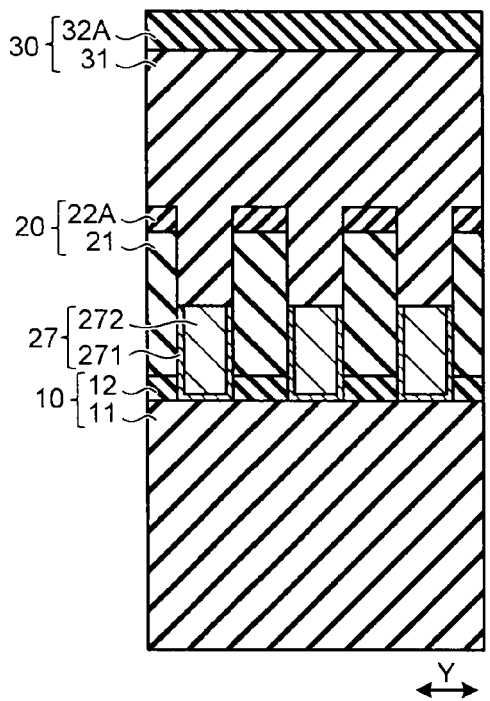
Figure 12G:
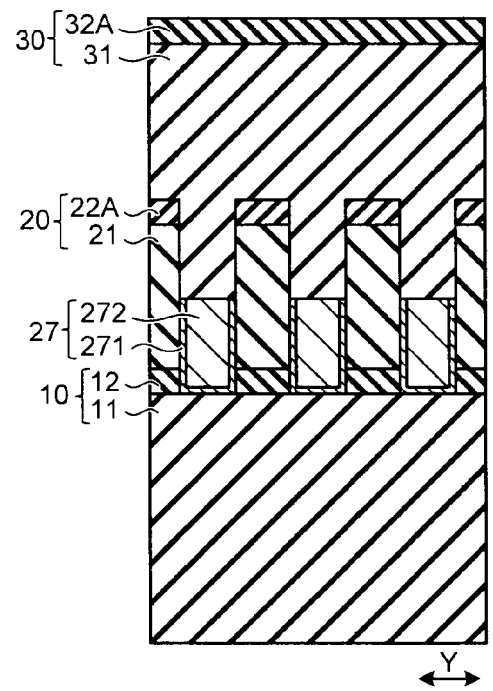
Figure 12H:
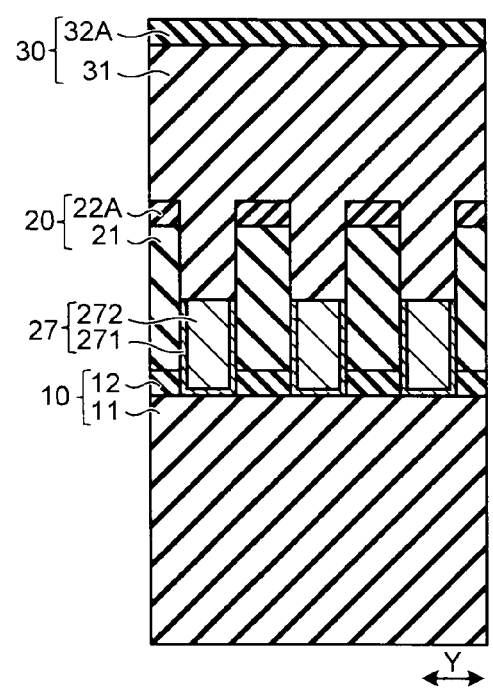

In the above explanation, the method of manufacturing the nonvolatile memory device having the structure in which the two or more layers of variable resistance memory cells MC are laminated is explained. However, when the variable resistance memory cells MC are provided in one layer, the thickness of the silicon oxide film 21 of the second interlayer insulating film 20 formed in FIG. 9A (FIGS. 10A, 11A, and 12A) is halved to about 100 nanometers. Then, the processing from FIG. 9A (FIGS. 10A, 11A, and 12A) to FIG. 9D (FIGS. 10D, 11D, and 12D) is performed. In FIG. 9D (FIGS. 10D, 11D, and 12D), when the second wires 27 present on the upper surface of the silicon nitride film 22A are removed by the CMP method without etching back the second wires 27, the processing for manufacturing the nonvolatile memory device including the one layer of variable resistance memory cells MC finishes. When the variable resistance memory cells MC are laminated in multiple layers, the processing for manufacturing a nonvolatile memory device can also be finished at a point when steps same as those in FIG. 9A (FIGS. 10A, 11A, and 12A) to FIG. 9D (FIGS. 10D, 11D, and 12D) are performed without etching back the second wires 27.

As explained above, according to the second embodiment, the silicon nitride films 12 and 22A used as the etching stopper films in the interlayer insulating films 10 and 20 and having dielectric constants larger than that of a silicon oxide film can be removed as much as possible. Therefore, an effect that a capacity among wires can be reduced compared with that in the first embodiment can be obtained in addition to the effect of the first embodiment.

In the first and second embodiments, the interface Schottky barrier between the P-type or N-type polysilicon and the resistance change material is used as the rectifying layers 25 and 35 (nonlinear elements). However, the rectifying layers 25 and 35 are not limited to this. For example, a PN junction diode of a semiconductor such as polysilicon, a metal oxide, or the like can be used.

As a positional relation between the rectifying layers 25 and 35 and the variable resistive layers 24 and 34, in the first and second embodiments, the variable resistive layers 24 and 34 are formed lower and the rectifying layers 25 and 35 are formed on the variable resistive layers 24 and 34. However, the positional relation is not limited to this. The upper layers and the lower layers can be reversed.

The silicon nitride films 12, 22, and 32 are provided in the upper parts of the first to third interlayer insulating films 10, 20, and 30, respectively. However, the silicon nitride films 12, 22, and 32 are not limited to this. The silicon nitride films 12, 22, and 32 can be replaced with another insulating films whose etching selectivity can be set with respect to the silicon oxide films 11, 12, and 31, the first and second wires 14 and 27, and silicon films. Also Metal other than TiN and W and a silicide material can be used as a material of the first to third wires 14, 27, and 37.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile memory device comprising:
a first wire embedded in a first groove that is formed in a first insulating film and extends in a first direction;
a second insulating film formed above the first insulating film;
a wiring material film that constitutes a second wire, which is embedded in a second groove that is formed in the second insulating film and extends in a second direction, and is formed of a single material; and
a variable resistance memory cell including a resistance change element and a rectifying element arranged to be held between the first wire and the wiring material film in a position where the first wire and the wiring material film intersect, the variable resistance memory cell being embedded in the first groove, and an upper surface of the variable resistance memory cell is lower than an upper surface of the first insulating film; and
a barrier metal having a U-shape directly above the variable resistance memory cell,
wherein the variable resistance memory cell has a rectangular shape with a length of the rectangular shape in the second direction that is same as a width of the first wire, and a length of the rectangular shape in the first direction that is same as a width of the second wire, and a lowest portion of a lower surface of the wiring material film is lower than the upper surface of the first insulating film, and
wherein the wiring material film is disposed in an inside of the U-shape.

2. The nonvolatile memory device according to claim 1, wherein the rectifying element includes a semiconductor layer having PIN structure.

* * * * *